United States Patent
Thandri et al.

(10) Patent No.: US 9,620,101 B1
(45) Date of Patent: Apr. 11, 2017

(54) SYSTEMS AND METHODS FOR MAINTAINING PLAYBACK FIDELITY IN AN AUDIO SYSTEM WITH ADAPTIVE NOISE CANCELLATION

(71) Applicant: Cirrus Logic, Inc., Austin, TX (US)

(72) Inventors: Bharath Kumar Thandri, Austin, TX (US); Aniruddha Satoskar, Austin, TX (US); Jeffrey D. Alderson, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 546 days.

(21) Appl. No.: 14/048,485

(22) Filed: Oct. 8, 2013

(51) Int. Cl.
  *G10K 11/16* (2006.01)
(52) U.S. Cl.
  CPC .................... *G10K 11/16* (2013.01)
(58) Field of Classification Search
  CPC ............... H03F 1/025; H03F 2200/507; H03F 2200/03; H03F 1/0211
  USPC ... 381/71.6, 71.11, 120, 121, 123, 150, 323; 704/255; 330/151
  See application file for complete search history.

(56) References Cited

U.S. PATENT DOCUMENTS

| | | | |
|---|---|---|---|
| 5,117,401 A | 5/1992 | Feintuch | |
| 5,251,263 A | 10/1993 | Andrea et al. | |
| 5,278,913 A | 1/1994 | Delfosse et al. | |
| 5,321,759 A | 6/1994 | Yuan | |
| 5,337,365 A | 8/1994 | Hamabe et al. | |
| 5,359,662 A | 10/1994 | Yuan et al. | |
| 5,377,276 A | 12/1994 | Terai et al. | |
| 5,410,605 A | 4/1995 | Sawada et al. | |
| 5,425,105 A | 6/1995 | Lo et al. | |
| 5,445,517 A | 8/1995 | Kondou et al. | |

(Continued)

FOREIGN PATENT DOCUMENTS

| | | |
|---|---|---|
| CN | 101552939 A | 10/2009 |
| DE | 102011013343 A1 | 9/2012 |

(Continued)

OTHER PUBLICATIONS

Kou, Sen and Tsai, Jianming, Residual noise shaping technique for active noise control systems, J. Acoust. Soc. Am. 95 (3), Mar. 1994, pp. 1665-1668.

(Continued)

*Primary Examiner* — Md S Elahee
(74) *Attorney, Agent, or Firm* — Jackson Walker L.L.P.

(57) ABSTRACT

An audio amplifier circuit may include a power amplifier, a charge pump power supply, and a control circuit. The power amplifier may have an audio input for receiving an audio input signal, an audio output for providing the output signal, and a power supply input. The charge pump power supply may provide a power supply voltage to the power supply input. The charge pump power supply may have a select input for selecting an operating mode of the power supply. In a first operating mode, the power supply voltage may equal to a first voltage, and in a second operating mode, the power supply voltage may be substantially equal to a second voltage which is a rational fraction of the first voltage. The control circuit may generate the select input based on a magnitude of anti-noise generated by an adaptive noise cancellation system associated with the audio transducer.

22 Claims, 6 Drawing Sheets

(56) References Cited

U.S. PATENT DOCUMENTS

| | | |
|---|---|---|
| 5,465,413 A | 11/1995 | Enge et al. |
| 5,481,615 A | 1/1996 | Eatwell et al. |
| 5,548,681 A | 8/1996 | Gleaves et al. |
| 5,559,893 A | 9/1996 | Krokstad |
| 5,563,819 A | 10/1996 | Nelson |
| 5,586,190 A | 12/1996 | Trantow et al. |
| 5,633,795 A | 5/1997 | Popovich |
| 5,640,450 A | 6/1997 | Watanabe |
| 5,668,747 A | 9/1997 | Ohashi |
| 5,696,831 A | 12/1997 | Inanga |
| 5,699,437 A | 12/1997 | Finn |
| 5,706,344 A | 1/1998 | Finn |
| 5,740,256 A | 4/1998 | Castello Da Costa et al. |
| 5,768,124 A | 6/1998 | Stothers et al. |
| 5,809,152 A | 9/1998 | Nakamura et al. |
| 5,815,582 A | 9/1998 | Claybaugh et al. |
| 5,832,095 A | 11/1998 | Daniels |
| 5,909,498 A | 6/1999 | Smith |
| 5,940,519 A | 8/1999 | Kuo |
| 5,946,391 A | 8/1999 | Dragwidge et al. |
| 5,991,418 A | 11/1999 | Kuo |
| 6,041,126 A | 3/2000 | Terai et al. |
| 6,118,878 A | 9/2000 | Jones |
| 6,185,300 B1 | 2/2001 | Romesburg |
| 6,219,427 B1 | 4/2001 | Kates et al. |
| 6,278,786 B1 | 8/2001 | McIntosh |
| 6,282,176 B1 | 8/2001 | Hemkumar |
| 6,317,501 B1 | 11/2001 | Matsuo |
| 6,418,228 B1 | 7/2002 | Terai et al. |
| 6,434,246 B1 | 8/2002 | Kates et al. |
| 6,434,247 B1 | 8/2002 | Kates et al. |
| 6,522,746 B1 | 2/2003 | Marchok et al. |
| 6,683,960 B1 | 1/2004 | Fujii et al. |
| 6,766,292 B1 | 7/2004 | Chandran et al. |
| 6,768,795 B2 | 7/2004 | Feltstrom et al. |
| 6,850,617 B1 | 2/2005 | Weigand |
| 6,940,982 B1 | 9/2005 | Watkins |
| 7,058,463 B1 | 6/2006 | Ruha et al. |
| 7,103,188 B1 | 9/2006 | Jones |
| 7,110,864 B2 | 9/2006 | Restrepo et al. |
| 7,181,030 B2 | 2/2007 | Rasmussen et al. |
| 7,330,739 B2 | 2/2008 | Somayajula |
| 7,365,669 B1 | 4/2008 | Melanson |
| 7,368,918 B2 | 5/2008 | Henson et al. |
| 7,406,179 B2 | 7/2008 | Ryan |
| 7,441,173 B2 | 10/2008 | Restrepo et al. |
| 7,466,838 B1 | 12/2008 | Mosely |
| 7,555,081 B2 | 6/2009 | Keele, Jr. |
| 7,680,456 B2 | 3/2010 | Muhammad et al. |
| 7,742,790 B2 | 6/2010 | Konchitsky et al. |
| 7,817,808 B2 | 10/2010 | Konchitsky et al. |
| 7,885,417 B2 | 2/2011 | Christoph |
| 8,019,050 B2 | 9/2011 | Mactavish et al. |
| 8,107,637 B2 | 1/2012 | Asada et al. |
| 8,144,888 B2 | 3/2012 | Berkhoff et al. |
| 8,155,334 B2 | 4/2012 | Joho et al. |
| 8,165,313 B2 | 4/2012 | Carreras |
| 8,249,262 B2 | 8/2012 | Chua et al. |
| 8,254,589 B2 | 8/2012 | Mitsuhata |
| 8,290,537 B2 | 10/2012 | Lee et al. |
| 8,311,243 B2 * | 11/2012 | Tucker ................ H02M 3/07 381/120 |
| 8,325,934 B2 | 12/2012 | Kuo |
| 8,363,856 B2 * | 1/2013 | Lesso ................ H02M 3/07 381/120 |
| 8,374,358 B2 | 2/2013 | Buck et al. |
| 8,379,884 B2 | 2/2013 | Horibe et al. |
| 8,401,200 B2 | 3/2013 | Tiscareno et al. |
| 8,401,204 B2 | 3/2013 | Odent et al. |
| 8,411,872 B2 | 4/2013 | Stothers et al. |
| 8,442,251 B2 | 5/2013 | Jensen et al. |
| 8,526,627 B2 | 9/2013 | Asao et al. |
| 8,526,628 B1 | 9/2013 | Massie et al. |
| 8,532,310 B2 | 9/2013 | Gauger, Jr. et al. |
| 8,539,012 B2 | 9/2013 | Clark |
| 8,804,974 B1 | 8/2014 | Melanson |
| 8,848,936 B2 | 9/2014 | Kwatra et al. |
| 8,907,829 B1 | 12/2014 | Naderi |
| 8,908,877 B2 | 12/2014 | Abdollahzadeh Milani et al. |
| 8,909,524 B2 | 12/2014 | Stoltz et al. |
| 8,942,976 B2 | 1/2015 | Li et al. |
| 8,948,407 B2 | 2/2015 | Alderson et al. |
| 8,948,410 B2 | 2/2015 | Van Leest |
| 8,958,571 B2 | 2/2015 | Kwatra et al. |
| 8,977,545 B2 | 3/2015 | Zeng et al. |
| 9,020,160 B2 | 4/2015 | Gauger, Jr. |
| 9,066,176 B2 | 6/2015 | Hendrix et al. |
| 9,082,391 B2 | 7/2015 | Yermeche et al. |
| 9,094,744 B1 | 7/2015 | Lu et al. |
| 9,106,989 B2 | 8/2015 | Li et al. |
| 9,107,010 B2 | 8/2015 | Abdollahzadeh Milani et al. |
| 9,203,366 B2 | 12/2015 | Eastty |
| 9,264,808 B2 | 2/2016 | Zhou et al. |
| 9,294,836 B2 | 3/2016 | Zhou et al. |
| 9,392,364 B1 | 7/2016 | Milani et al. |
| 9,460,701 B2 | 10/2016 | Yong et al. |
| 9,462,376 B2 | 10/2016 | Alderson |
| 9,478,210 B2 | 10/2016 | Hellman |
| 9,478,212 B1 | 10/2016 | Sorensen et al. |
| 9,479,860 B2 | 10/2016 | Kwatra et al. |
| 2001/0053228 A1 | 12/2001 | Jones |
| 2002/0003887 A1 | 1/2002 | Zhang et al. |
| 2003/0063759 A1 | 4/2003 | Brennan et al. |
| 2003/0072439 A1 | 4/2003 | Gupta |
| 2003/0185403 A1 | 10/2003 | Sibbald |
| 2004/0001450 A1 | 1/2004 | He et al. |
| 2004/0017921 A1 | 1/2004 | Mantovani |
| 2004/0047464 A1 | 3/2004 | Yu et al. |
| 2004/0120535 A1 | 6/2004 | Woods |
| 2004/0122879 A1 | 6/2004 | McGrath |
| 2004/0165736 A1 | 8/2004 | Hetherington et al. |
| 2004/0167777 A1 | 8/2004 | Hetherington et al. |
| 2004/0176955 A1 * | 9/2004 | Farinelli, Jr. ............ H03F 1/52 704/255 |
| 2004/0196992 A1 | 10/2004 | Ryan |
| 2004/0202333 A1 | 10/2004 | Czermak et al. |
| 2004/0240677 A1 | 12/2004 | Onishi et al. |
| 2004/0242160 A1 | 12/2004 | Ichikawa et al. |
| 2004/0264706 A1 | 12/2004 | Ray et al. |
| 2005/0004796 A1 | 1/2005 | Trump et al. |
| 2005/0018862 A1 | 1/2005 | Fisher |
| 2005/0110568 A1 * | 5/2005 | Robinson ................ H03F 1/02 330/151 |
| 2005/0117754 A1 | 6/2005 | Sakawaki |
| 2005/0175187 A1 | 8/2005 | Wright et al. |
| 2005/0207585 A1 | 9/2005 | Christoph |
| 2005/0240401 A1 | 10/2005 | Ebenezer |
| 2006/0013408 A1 | 1/2006 | Lee |
| 2006/0018460 A1 | 1/2006 | McCree |
| 2006/0035593 A1 | 2/2006 | Leeds |
| 2006/0055910 A1 | 3/2006 | Lee |
| 2006/0069556 A1 | 3/2006 | Nadjar et al. |
| 2006/0109941 A1 | 5/2006 | Keele, Jr. |
| 2006/0153400 A1 | 7/2006 | Fujita et al. |
| 2007/0030989 A1 | 2/2007 | Kates |
| 2007/0033029 A1 | 2/2007 | Sakawaki |
| 2007/0038441 A1 | 2/2007 | Inoue et al. |
| 2007/0047742 A1 | 3/2007 | Taenzer et al. |
| 2007/0053524 A1 | 3/2007 | Haulick et al. |
| 2007/0076896 A1 | 4/2007 | Hosaka et al. |
| 2007/0154031 A1 | 7/2007 | Avendano et al. |
| 2007/0208520 A1 | 9/2007 | Zhang et al. |
| 2007/0258597 A1 | 11/2007 | Rasmussen et al. |
| 2007/0297620 A1 | 12/2007 | Choy |
| 2008/0019548 A1 | 1/2008 | Avendano |
| 2008/0101589 A1 | 5/2008 | Horowitz et al. |
| 2008/0107281 A1 | 5/2008 | Togami et al. |
| 2008/0144853 A1 | 6/2008 | Sommerfeldt et al. |
| 2008/0166002 A1 | 7/2008 | Amsel |
| 2008/0177532 A1 | 7/2008 | Greiss et al. |
| 2008/0181422 A1 | 7/2008 | Christoph |
| 2008/0226098 A1 | 9/2008 | Haulick et al. |
| 2008/0240413 A1 | 10/2008 | Mohammed et al. |
| 2008/0240455 A1 | 10/2008 | Inoue et al. |

(56) References Cited

U.S. PATENT DOCUMENTS

| | | |
|---|---|---|
| 2008/0240457 A1 | 10/2008 | Inoue et al. |
| 2009/0012783 A1 | 1/2009 | Klein |
| 2009/0034748 A1 | 2/2009 | Sibbald |
| 2009/0041260 A1 | 2/2009 | Jorgensen et al. |
| 2009/0046867 A1 | 2/2009 | Clemow |
| 2009/0060222 A1 | 3/2009 | Jeong et al. |
| 2009/0080670 A1 | 3/2009 | Solbeck et al. |
| 2009/0086990 A1 | 4/2009 | Christoph |
| 2009/0136057 A1 | 5/2009 | Taenzer |
| 2009/0175461 A1 | 7/2009 | Nakamura et al. |
| 2009/0175466 A1 | 7/2009 | Elko et al. |
| 2009/0196429 A1 | 8/2009 | Ramakrishnan et al. |
| 2009/0220107 A1 | 9/2009 | Every et al. |
| 2009/0238369 A1 | 9/2009 | Ramakrishnan et al. |
| 2009/0245529 A1 | 10/2009 | Asada et al. |
| 2009/0254340 A1 | 10/2009 | Sun et al. |
| 2009/0290718 A1 | 11/2009 | Kahn et al. |
| 2009/0296965 A1 | 12/2009 | Kojima |
| 2009/0304200 A1 | 12/2009 | Kim et al. |
| 2009/0311979 A1 | 12/2009 | Husted et al. |
| 2010/0014683 A1 | 1/2010 | Maeda et al. |
| 2010/0014685 A1 | 1/2010 | Wurm |
| 2010/0061564 A1 | 3/2010 | Clemow et al. |
| 2010/0069114 A1 | 3/2010 | Lee et al. |
| 2010/0082339 A1 | 4/2010 | Konchitsky et al. |
| 2010/0098263 A1 | 4/2010 | Pan et al. |
| 2010/0098265 A1 | 4/2010 | Pan et al. |
| 2010/0124336 A1 | 5/2010 | Shridhar et al. |
| 2010/0124337 A1 | 5/2010 | Wertz et al. |
| 2010/0131269 A1 | 5/2010 | Park et al. |
| 2010/0142715 A1 | 6/2010 | Goldstein et al. |
| 2010/0150367 A1 | 6/2010 | Mizuno |
| 2010/0158330 A1 | 6/2010 | Guissin et al. |
| 2010/0166203 A1 | 7/2010 | Peissig et al. |
| 2010/0166206 A1 | 7/2010 | Macours |
| 2010/0183175 A1 | 7/2010 | Chen et al. |
| 2010/0195838 A1 | 8/2010 | Bright |
| 2010/0195844 A1 | 8/2010 | Christoph et al. |
| 2010/0207317 A1 | 8/2010 | Iwami et al. |
| 2010/0226210 A1 | 9/2010 | Kordis et al. |
| 2010/0246855 A1 | 9/2010 | Chen |
| 2010/0266137 A1 | 10/2010 | Sibbald et al. |
| 2010/0272276 A1 | 10/2010 | Carreras et al. |
| 2010/0272283 A1 | 10/2010 | Carreras et al. |
| 2010/0272284 A1 | 10/2010 | Joho et al. |
| 2010/0274564 A1 | 10/2010 | Bakalos et al. |
| 2010/0284546 A1 | 11/2010 | DeBrunner et al. |
| 2010/0291891 A1 | 11/2010 | Ridgers et al. |
| 2010/0296666 A1 | 11/2010 | Lin |
| 2010/0296668 A1 | 11/2010 | Lee et al. |
| 2010/0310086 A1 | 12/2010 | Magrath et al. |
| 2010/0310087 A1 | 12/2010 | Ishida |
| 2010/0316225 A1 | 12/2010 | Saito et al. |
| 2010/0322430 A1 | 12/2010 | Isberg |
| 2011/0002468 A1 | 1/2011 | Tanghe |
| 2011/0007907 A1 | 1/2011 | Park et al. |
| 2011/0026724 A1 | 2/2011 | Doclo |
| 2011/0091047 A1 | 4/2011 | Konchitsky et al. |
| 2011/0096933 A1 | 4/2011 | Eastty |
| 2011/0099010 A1 | 4/2011 | Zhang |
| 2011/0106533 A1 | 5/2011 | Yu |
| 2011/0116643 A1 | 5/2011 | Tiscareno |
| 2011/0129098 A1 | 6/2011 | Delano et al. |
| 2011/0130176 A1 | 6/2011 | Magrath et al. |
| 2011/0142247 A1 | 6/2011 | Fellers et al. |
| 2011/0144984 A1 | 6/2011 | Konchitsky |
| 2011/0150257 A1 | 6/2011 | Jensen |
| 2011/0158419 A1 | 6/2011 | Theverapperuma et al. |
| 2011/0206214 A1 | 8/2011 | Christoph et al. |
| 2011/0222698 A1 | 9/2011 | Asao et al. |
| 2011/0222701 A1 | 9/2011 | Donaldson |
| 2011/0249826 A1 | 10/2011 | Van Leest |
| 2011/0288860 A1 | 11/2011 | Schevciw et al. |
| 2011/0293103 A1 | 12/2011 | Park et al. |
| 2011/0299695 A1 | 12/2011 | Nicholson |
| 2011/0305347 A1 | 12/2011 | Wurm |
| 2011/0317848 A1 | 12/2011 | Ivanov et al. |
| 2012/0057720 A1 | 3/2012 | Van Leest |
| 2012/0084080 A1 | 4/2012 | Konchitsky et al. |
| 2012/0135787 A1 | 5/2012 | Kusunoki et al. |
| 2012/0140917 A1 | 6/2012 | Nicholson et al. |
| 2012/0140942 A1 | 6/2012 | Loeda |
| 2012/0140943 A1 | 6/2012 | Hendrix et al. |
| 2012/0148062 A1 | 6/2012 | Scarlett et al. |
| 2012/0155666 A1 | 6/2012 | Nair |
| 2012/0170766 A1 | 7/2012 | Alves et al. |
| 2012/0179458 A1 | 7/2012 | Oh et al. |
| 2012/0185524 A1 | 7/2012 | Clark |
| 2012/0207317 A1 | 8/2012 | Abdollahzadeh Milani et al. |
| 2012/0215519 A1 | 8/2012 | Park et al. |
| 2012/0250873 A1 | 10/2012 | Bakalos et al. |
| 2012/0259626 A1 | 10/2012 | Li et al. |
| 2012/0263317 A1 | 10/2012 | Shin et al. |
| 2012/0281850 A1 | 11/2012 | Hyatt |
| 2012/0300958 A1 | 11/2012 | Klemmensen |
| 2012/0300960 A1 | 11/2012 | Mackay et al. |
| 2012/0308021 A1 | 12/2012 | Kwatra et al. |
| 2012/0308024 A1 | 12/2012 | Alderson et al. |
| 2012/0308025 A1 | 12/2012 | Hendrix et al. |
| 2012/0308026 A1 | 12/2012 | Kamath et al. |
| 2012/0308027 A1 | 12/2012 | Kwatra |
| 2012/0308028 A1 | 12/2012 | Kwatra et al. |
| 2012/0310640 A1 | 12/2012 | Kwatra et al. |
| 2012/0316872 A1 | 12/2012 | Stoltz et al. |
| 2013/0010982 A1 | 1/2013 | Elko et al. |
| 2013/0022213 A1 | 1/2013 | Alcock |
| 2013/0083939 A1 | 4/2013 | Fellers et al. |
| 2013/0156238 A1 | 6/2013 | Birch et al. |
| 2013/0222516 A1 | 8/2013 | Do et al. |
| 2013/0243198 A1 | 9/2013 | Van Rumpt |
| 2013/0243225 A1 | 9/2013 | Yokota |
| 2013/0259251 A1 | 10/2013 | Bakalos |
| 2013/0272539 A1 | 10/2013 | Kim et al. |
| 2013/0287218 A1 | 10/2013 | Alderson et al. |
| 2013/0287219 A1 | 10/2013 | Hendrix et al. |
| 2013/0301842 A1 | 11/2013 | Hendrix et al. |
| 2013/0301846 A1 | 11/2013 | Alderson et al. |
| 2013/0301847 A1 | 11/2013 | Alderson et al. |
| 2013/0301848 A1 | 11/2013 | Zhou et al. |
| 2013/0301849 A1 | 11/2013 | Alderson |
| 2013/0315403 A1 | 11/2013 | Samuelsson |
| 2013/0343556 A1 | 12/2013 | Bright |
| 2013/0343571 A1 | 12/2013 | Rayala et al. |
| 2014/0036127 A1 | 2/2014 | Pong et al. |
| 2014/0044275 A1* | 2/2014 | Goldstein ............ H04R 3/002 381/71.6 |
| 2014/0050332 A1 | 2/2014 | Nielsen et al. |
| 2014/0051483 A1 | 2/2014 | Schoerkmaier |
| 2014/0072134 A1 | 3/2014 | Po et al. |
| 2014/0072135 A1 | 3/2014 | Bajic et al. |
| 2014/0086425 A1 | 3/2014 | Jensen et al. |
| 2014/0126735 A1 | 5/2014 | Gauger, Jr. |
| 2014/0169579 A1 | 6/2014 | Azmi |
| 2014/0177851 A1 | 6/2014 | Kitazawa et al. |
| 2014/0177890 A1 | 6/2014 | Hojlund et al. |
| 2014/0211953 A1 | 7/2014 | Alderson et al. |
| 2014/0226827 A1 | 8/2014 | Abdollahzadeh Milani et al. |
| 2014/0270222 A1 | 9/2014 | Hendrix et al. |
| 2014/0270223 A1 | 9/2014 | Li et al. |
| 2014/0270224 A1 | 9/2014 | Zhou et al. |
| 2014/0294182 A1 | 10/2014 | Axelsson |
| 2014/0307887 A1 | 10/2014 | Alderson et al. |
| 2014/0307888 A1 | 10/2014 | Alderson et al. |
| 2014/0307890 A1 | 10/2014 | Zhou et al. |
| 2014/0307899 A1 | 10/2014 | Hendrix et al. |
| 2014/0314244 A1 | 10/2014 | Yong et al. |
| 2014/0314246 A1 | 10/2014 | Hellman |
| 2014/0314247 A1 | 10/2014 | Zhang |
| 2014/0341388 A1 | 11/2014 | Goldstein |
| 2014/0369517 A1 | 12/2014 | Zhou et al. |
| 2015/0078572 A1 | 3/2015 | Milani et al. |
| 2015/0092953 A1 | 4/2015 | Abdollahzadeh Milani et al. |
| 2015/0104032 A1 | 4/2015 | Kwatra et al. |
| 2015/0161980 A1 | 6/2015 | Alderson et al. |

(56) References Cited

U.S. PATENT DOCUMENTS

| | | |
|---|---|---|
| 2015/0161981 A1 | 6/2015 | Kwatra |
| 2015/0163592 A1 | 6/2015 | Alderson |
| 2015/0256660 A1 | 9/2015 | Kaller et al. |
| 2015/0256953 A1 | 9/2015 | Kwatra et al. |
| 2015/0269926 A1 | 9/2015 | Alderson et al. |
| 2015/0365761 A1 | 12/2015 | Alderson et al. |
| 2016/0180830 A1 | 6/2016 | Lu et al. |

FOREIGN PATENT DOCUMENTS

| | | |
|---|---|---|
| EP | 0412902 A2 | 2/1991 |
| EP | 0756407 A2 | 1/1997 |
| EP | 0898266 A2 | 2/1999 |
| EP | 1691577 A2 | 8/2006 |
| EP | 1880699 A2 | 1/2008 |
| EP | 1947642 A1 | 7/2008 |
| EP | 2133866 A1 | 12/2009 |
| EP | 2237573 A1 | 10/2010 |
| EP | 2216774 A1 | 8/2011 |
| EP | 2395500 A1 | 12/2011 |
| EP | 2395501 A1 | 12/2011 |
| EP | 2551845 A1 | 1/2013 |
| EP | 2583074 A1 | 4/2013 |
| GB | 2401744 A | 11/2004 |
| GB | 2436657 A | 10/2007 |
| GB | 2455821 A | 6/2009 |
| GB | 2455824 A | 6/2009 |
| GB | 2455828 A | 6/2009 |
| GB | 2484722 A | 4/2012 |
| JP | 06006246 | 1/1994 |
| JP | H06186985 A | 7/1994 |
| JP | H06232755 | 8/1994 |
| JP | 07098592 | 4/1995 |
| JP | 07325588 A | 12/1995 |
| JP | H11305783 A | 11/1999 |
| JP | 2000089770 | 3/2000 |
| JP | 2002010355 | 1/2002 |
| JP | 2004007107 | 1/2004 |
| JP | 2006217542 A | 8/2006 |
| JP | 2007060644 | 3/2007 |
| JP | 2008015046 A | 1/2008 |
| JP | 2010277025 | 12/2010 |
| JP | 2011061449 | 3/2011 |
| WO | 9911045 | 3/1999 |
| WO | 03015074 A1 | 2/2003 |
| WO | 03015275 A1 | 2/2003 |
| WO | WO2004009007 A1 | 1/2004 |
| WO | 2004017303 A1 | 2/2004 |
| WO | 2006125061 A1 | 11/2006 |
| WO | 2006128768 A1 | 12/2006 |
| WO | 2007007916 A1 | 1/2007 |
| WO | 2007011337 A1 | 1/2007 |
| WO | 2007110807 A2 | 10/2007 |
| WO | 2007113487 A1 | 11/2007 |
| WO | 2009041012 A1 | 4/2009 |
| WO | 2009110087 A1 | 9/2009 |
| WO | 2009155696 A1 | 12/2009 |
| WO | 2010117714 A1 | 10/2010 |
| WO | 2011035061 A1 | 3/2011 |
| WO | 2012107561 A1 | 8/2012 |
| WO | 2012119808 A2 | 9/2012 |
| WO | 2012134874 A1 | 10/2012 |
| WO | 2012166273 A2 | 12/2012 |
| WO | 2012166388 A2 | 12/2012 |
| WO | 2013106370 A1 | 7/2013 |
| WO | 2014158475 A1 | 10/2014 |
| WO | 2014168685 A2 | 10/2014 |
| WO | 2014172005 A1 | 10/2014 |
| WO | 2014172006 A1 | 10/2014 |
| WO | 2014172010 A1 | 10/2014 |
| WO | 2014172019 A1 | 10/2014 |
| WO | 2014172021 A1 | 10/2014 |
| WO | 2014200787 A1 | 12/2014 |
| WO | 2015038255 A1 | 3/2015 |
| WO | 2015088639 A | 6/2015 |
| WO | 2015088639 A1 | 6/2015 |
| WO | 2015088651 A1 | 6/2015 |
| WO | 2015088653 A1 | 6/2015 |
| WO | 2015134225 A1 | 9/2015 |
| WO | 2015191691 A1 | 12/2015 |
| WO | 2016054186 A1 | 4/2016 |
| WO | 2016100602 A1 | 6/2016 |

OTHER PUBLICATIONS

Pfann, et al., "LMS Adaptive Filtering with Delta-Sigma Modulated Input Signals," IEEE Signal Processing Letters, Apr. 1998, pp. 95-97, vol. 5, No. 4, IEEE Press, Piscataway, NJ.

Toochinda, et al., "A Single-Input Two-Output Feedback Formulation for ANC Problems," Proceedings of the 2001 American Control Conference, Jun. 2001, pp. 923-928, vol. 2, Arlington, VA.

Kuo, et al., "Active Noise Control: A Tutorial Review," Proceedings of the IEEE, Jun. 1999, pp. 943-973, vol. 87, No. 6, IEEE Press, Piscataway, NJ.

Johns, et al., "Continuous-Time LMS Adaptive Recursive Filters," IEEE Transactions on Circuits and Systems, Jul. 1991, pp. 769-778, vol. 38, No. 7, IEEE Press, Piscataway, NJ.

Shoval, et al., "Comparison of DC Offset Effects in Four LMS Adaptive Algorithms," IEEE Transactions on Circuits and Systems II: Analog and Digital Processing, Mar. 1995, pp. 176-185, vol. 42, Issue 3, IEEE Press, Piscataway, NJ.

Mali, Dilip, "Comparison of DC Offset Effects on LMB Algorithm and its Derivatives," International Journal of Recent Trends in Engineering, May 2009, pp. 323-328, vol. 1, No. 1, Academy Publisher.

Kates, James M., "Principles of Digital Dynamic Range Compression," Trends in Amplification, Spring 2005, pp. 45-76, vol. 9, No. 2, Sage Publications.

Gao, et al., "Adaptive Linearization of a Loudspeaker," IEEE International Conference on Acoustics, Speech, and Signal Processing, Apr. 14-17, 1991, pp. 3589-3592, Toronto, Ontario, CA.

Silva, et al., "Convex Combination of Adaptive Filters With Different Tracking Capabilities," IEEE International Conference on Acoustics, Speech, and Signal Processing, Apr. 15-20, 2007, pp. III 925-928, vol. 3, Honolulu, HI, USA.

Akhtar, et al., "A Method for Online Secondary Path Modeling in Active Noise Control Systems," IEEE International Symposium on Circuits and Systems, May 23-26, 2005, pp. 264-267, vol. 1, Kobe, Japan.

Davari, et al., "A New Online Secondary Path Modeling Method for Feedforward Active Noise Control Systems," IEEE International Conference on Industrial Technology, Apr. 21-24, 2008, pp. 1-6, Chengdu, China.

Lan, et al., "An Active Noise Control System Using Online Secondary Path Modeling With Reduced Auxiliary Noise," IEEE Signal Processing Letters, Jan. 2002, pp. 16-18, vol. 9, Issue 1, IEEE Press, Piscataway, NJ.

Liu, et al., "Analysis of Online Secondary Path Modeling With Auxiliary Noise Scaled by Residual Noise Signal," IEEE Transactions on Audio, Speech and Language Processing, Nov. 2010, pp. 1978-1993, vol. 18, Issue 8, IEEE Press, Piscataway, NJ.

Booji, P.S., Berkhoff, A.P., Virtual sensors for local, three dimensional, broadband multiple-channel active noise control and the effects on the quiet zones, Proceedings of ISMA2010 including USD2010, pp. 151-166.

Lopez-Caudana, Edgar Omar, Active Noise Cancellation: The Unwanted Signal and The Hybrid Solution, Adaptive Filtering Applications, Dr. Lino Garcia, ISBN: 978-953-307-306-4, InTech.

D. Senderowicz et al., "Low-Voltage Double-Sampled Delta-Sigma Converters," IEEE J. Solid-State Circuits, vol. 32,, No. 12, pp. 1907-1919, Dec. 1997, 13 pages.

Hurst, P.J. and Dyer, K.C., "An improved double sampling scheme for switched-capacitor delta-sigma modulators," IEEE Int. Symp. Circuits Systems, May 1992, vol. 3, pp. 1179-1182, 4 pages.

Milani, et al., "On Maximum Achievable Noise Reduction in ANC Systems", Proceedings of the IEEE International Conference on Acoustics, Speech, and Signal Processing, ICASSP 2010, Mar. 14-19, 2010 pp. 349-352.

(56) References Cited

OTHER PUBLICATIONS

Ryan, et al., "Optimum near-field performance of microphone arrays subject to a far-field beampattern constraint", 2248 J. Acoust. Soc. Am. 108, Nov. 2000.
Cohen, et al., "Noise Estimation by Minima Controlled Recursive Averaging for Robust Speech Enhancement", IEEE Signal Processing Letters, vol. 9, No. 1, Jan. 2002.
Martin, "Noise Power Spectral Density Estimation Based on Optimal Smoothing and Minimum Statistics", IEEE Trans. on Speech and Audio Processing, col. 9, No. 5, Jul. 2001.
Martin, "Spectral Subtraction Based on Minimum Statistics", Proc. 7th EUSIPCO '94, Edinburgh, U.K., Sep. 13-16, 1994, pp. 1182-1195.
Cohen, "Noise Spectrum Estimation in Adverse Environments: Improved Minima Controlled Recursive Averaging", IEEE Trans. on Speech & Audio Proc., vol. 11, Issue 5, Sep. 2003.
Black, John W., "An Application of Side-Tone in Subjective Tests of Microphones and Headsets", Project Report No. NM 001 064.01.20, Research Report of the U.S. Naval School of Aviation Medicine, Feb. 1, 1954, 12 pages (pp. 1-12 in pdf), Pensacola, FL, US.
Lane, et al., "Voice Level: Autophonic Scale, Perceived Loudness, and the Effects of Sidetone", The Journal of the Acoustical Society of America, Feb. 1961, pp. 160-167, vol. 33, No. 2., Cambridge, MA, US.
Liu, et al., "Compensatory Responses to Loudness-shifted Voice Feedback During Production of Mandarin Speech", Journal of the Acoustical Society of America, Oct. 2007, pp. 2405-2412, vol. 122, No. 4.
Paepcke, et al., "Yelling in the Hall: Using Sidetone to Address a Problem with Mobile Remote Presence Systems", Symposium on User Interface Software and Technology, Oct. 16-19, 2011, 10 pages (pp. 1-10 in pdf), Santa Barbara, CA, US.
Peters, Robert W., "The Effect of High-Pass and Low-Pass Filtering of Side-Tone Upon Speaker Intelligibility", Project Report No. NM 001 064.01.25, Research Report of the U.S. Naval School of Aviation Medicine, Aug. 16, 1954, 13 pages (pp. 1-13 in pdf), Pensacola, FL, US.
Therrien, et al., "Sensory Attenuation of Self-Produced Feedback: The Lombard Effect Revisited", PLOS ONE, Nov. 2012, pp. 1-7, vol. 7, Issue 11, e49370, Ontario, Canada.
Jin, et al., "A simultaneous equation method-based online secondary path modeling algorithm for active noise control", Journal of Sound and Vibration, Apr. 25, 2007, pp. 455-474, vol. 303, No. 3-5, London, GB.
Erkelens et al., "Tracking of Nonstationary Noise Based on Data-Driven Recursive Noise Power Estimation", IEEE Transactions on Audio Speech, and Language Processing, vol. 16, No. 6, Aug. 2008.
Rao et al., "A Novel Two Stage Single Channle Speech Enhancement Technique", India Conference (INDICON) 2011 Annual IEEE, IEEE, Dec. 15, 2011.
Rangachari et al., "A noise-estimation algorithm for highly non-stationary environments" Speech Communication, Elsevier Science Publishers, vol. 48, No. 2, Feb. 1, 2006.
International Search Report and Written Opinion of the International Searching Authority, International Patent Application No. PCT/US2014/017343, mailed Aug. 8, 2014, 22 pages.
International Search Report and Written Opinion of the International Searching Authority, International Patent Application No. PCT/US2014/018027, mailed Sep. 4, 2014, 14 pages.
International Search Report and Written Opinion of the International Searching Authority, International Patent Application No. PCT/US2014/017374, mailed Sep. 8, 2014, 13 pages.
International Search Report and Written Opinion of the International Searching Authority, International Patent Application No. PCT/US2014/019395, mailed Sep. 9, 2014, 14 pages.
International Search Report and Written Opinion of the International Searching Authority, International Patent Application No. PCT/US2014/019469, mailed Sep. 12, 2014, 13 pages.
Feng, Jinwei et al., "A broadband self-tuning active noise equaliser", Signal Processing, Elsevier Science Publishers B.V. Amsterdam, NL, vol. 62, No. 2, Oct. 1, 1997, pp. 251-256.
Zhang, Ming et al., "A Robust Online Secondary Path Modeling Method with Auxiliary Noise Power Scheduling Strategy and Norm Constraint Manipulation", IEEE Transactions on Speech and Audio Processing, IEEE Service Center, New York, NY, vol. 11, No. 1, Jan. 1, 2003.
Lopez-Gaudana, Edgar et al., "A hybrid active noise cancelling with secondary path modeling", 51st Midwest Symposium on Circuits and Systems, 2008, MWSCAS 2008, Aug. 10, 2008, pp. 277-280.
International Patent Application No. PCT/US2015/017124, International Search Report and Written Opinion, Jul. 13, 2015, 19 pages.
International Patent Application No. PCT/US2015/035073, International Search Report and Written Opinion, Oct. 8, 2015, 11 pages.
International Patent Application No. PCT/US2014/049600, International Search Report and Written Opinion, Jan. 14, 2015, 12 pages.
International Patent Application No. PCT/US2014/061753, International Search Report and Written Opinion, Feb. 9, 2015, 8 pages.
International Patent Application No. PCT/US2014/061548, International Search Report and Written Opinion, Feb. 12, 2015, 13 pages.
International Patent Application No. PCT/US2014/060277, International Search Report and Written Opinion, Mar. 9, 2015, 11 pages.
Campbell, Mikey, "Apple looking into self-adjusting earbud headphones with noise cancellation tech", Apple Insider, Jul. 4, 2013, pp. 1-10 (10 pages in pdf), downloaded on May 14, 2014 from http://appleinsider.com/articles/13/07/04/apple-looking-into-self-adjusting-earbud-headphones-with-noise-cancellation-tech.
International Patent Application No. PCT/US2014/017096, International Search Report and Written Opinion, May 27, 2014, 11 pages.
Ray, Laura et al., Hybrid Feedforward-Feedback Active Noise Reduction for Hearing Protection and Communication, The Journal of the Acoustical Society of America, American Institute of Physics for the Acoustical Society of America, New York, NY, vol. 120, No. 4, Jan. 2006, pp. 2026-2036.
International Patent Application No. PCT/US2014/017112, International Search Report and Written Opinion, May 8, 2015, 22 pages.
Widrow, B. et al., Adaptive Noise Cancelling: Principles and Applications, Proceedings of the IEEE, IEEE, New York, NY, U.S., vol. 63, No. 13, Dec. 1975, pp. 1692-1716.
Morgan, Dennis R. et al., A Delayless Subband Adaptive Filter Architecture, IEEE Transactions on Signal Processing, IEEE Service Center, New York, NY, U.S., vol. 43, No. 8, Aug. 1995, pp. 1819-1829.
International Patent Application No. PCT/US2014/040999, International Search Report and Written Opinion, Oct. 18, 2014, 12 pages.
International Patent Application No. PCT/US2013/049407, International Search Report and Written Opinion, Jun. 18, 2014, 13 pages.
Parkins, et al., Narrowband and broadband active control in an enclosure using the acoustic energy density, J. Acoust. Soc. Am. Jul. 2000, pp. 192-203, vol. 108, issue 1, U.S.
International Patent Application No. PCT/US2015/022113, International Search Report and Written Opinion, Jul. 23, 2015, 13 pages.
Combined Search and Examination Report, Application No. GB1512832.5, mailed Jan. 28, 2016, 7 pages.
English machine translation of JP 2006-217542 A (Okumura, Hiroshi; Howling Suppression Device and Loudspeaker, published Aug. 2006).
International Patent Application No. PCT/US2015/066260, International Search Report and Written Opinion, Apr. 21, 2016, 13 pages.
Combined Search and Examination Report, Application No. GB1519000.2, mailed Apr. 21, 2016, 5 pages.
Combined Search and Examination Report under Sections 17 and 18(3), United Kingdom Application No. GB1611064.5, mailed Dec. 28, 2016.

(56) References Cited

OTHER PUBLICATIONS

Combined Search and Examination Report under Sections 17 and 18(3), United Kingdom Application No. GB1611080.1, mailed Dec. 28, 2016.

International Search Report and Written Opinion of the International Searching Authority, International Application No. PCT/US2016/047828, mailed Dec. 1, 2016.

International Search Report and Written Opinion of the International Searching Authority, International Application No. PCT/US2016/039523, mailed Dec. 7, 2016.

Wu, Lifu et al., "Decoupling feedforward and feedback structures in hybrid active noise control systems for uncorrelated narrowband disturbances", Journal of Sound and Vibration, vol. 350, Aug. 18, 2015, pp. 1-10, Section 2, figures 1-3.

Lopez-Caudana, Edgar et al., "A Hybrid Noise Cancelling Algorithm with Secondary Path Estimation", WSEAS Transactions on Signal Processing, vol. 4, No. 12, Dec. 1, 2008, pp. 677=687, Sections 2 and 3, figures 4-8.

\* cited by examiner

… (1)

SYSTEMS AND METHODS FOR MAINTAINING PLAYBACK FIDELITY IN AN AUDIO SYSTEM WITH ADAPTIVE NOISE CANCELLATION

FIELD OF DISCLOSURE

The present disclosure relates in general to circuits for personal audio devices such as wireless telephones and media players, and more specifically, to systems and methods for maintaining playback fidelity in a personal audio device output stage wherein the personal audio device employs adaptive noise cancellation.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers, and the power amplifier may often be the primary consumer of power in a personal audio device, and thus, may have the greatest effect on the battery life of the personal audio device. In devices having a linear power amplifier for the output stage, power is wasted during low signal level outputs, because the voltage drop across the active output transistor plus the output voltage will be equal to the constant power supply rail voltage. Therefore, amplifier topologies such as Class-G and Class-H are desirable for reducing the voltage drop across the output transistor(s) and thereby reducing the power wasted in dissipation by the output transistor(s). In such topologies, power consumption is reduced by employing a power supply, typically a charge pump power supply, which has selectable modes of operation based on an amplitude of an audio output signal of the power amplifier, wherein each of the selectable modes provides a different bi-polar supply voltage across power supply rails of the power amplifier.

Performance of personal audio devices with respect to intelligibility can be improved by providing noise canceling using a microphone to measure ambient acoustic events and then using signal processing to insert an anti-noise signal into the output of the device to cancel the ambient acoustic events. Noise canceling approaches often employ an error microphone for sensing a combined acoustic pressure (e.g., combination of desired sound and undesired ambient noise) near a listener's ear drum in order to remove undesired components (e.g., the undesired ambient noise) of the combined acoustic pressure.

A potential drawback of using adaptive noise cancellation with a selectable-mode power supply is that an injected anti-noise signal may have a magnitude that causes clipping of an audio output signal, and the clipping of the output signal may cause instability of other undesirable operation of the adaptive noise cancellation system due to the fact that the system may adapt based on a measured output signal at the error microphone.

SUMMARY

In accordance with the teachings of the present disclosure, the disadvantages and problems associated with existing approaches to driving audio output signals may be reduced or eliminated.

In accordance with embodiments of the present disclosure, an audio amplifier circuit for providing an output signal to an audio transducer may include a power amplifier, a charge pump power supply, and a control circuit. The power amplifier may have an audio input for receiving an audio input signal, an audio output for providing the output signal, and a power supply input. The charge pump power supply may provide a power supply voltage to the power supply input of the power amplifier. The charge pump power supply may have a select input for selecting an operating mode of the power supply. In a first operating mode, the power supply voltage may be equal to a first voltage, and in a second operating mode, the power supply voltage may be substantially equal to a second voltage which is a rational fraction of the first voltage. The control circuit may generate the select input based on a magnitude of anti-noise generated by an adaptive noise cancellation system associated with the audio transducer.

In accordance with these and other embodiments of the present disclosure, an audio amplifier circuit for providing an output signal to an audio transducer may include a power amplifier, a charge pump power supply, a clip detection circuit, and an adaptive noise cancellation circuit. The power amplifier may have an audio input for receiving an audio input signal, an audio output for providing the output signal, and a power supply input. The charge pump power supply may provide a power supply voltage to the power supply input of the power amplifier. The charge pump power supply may have a select input for selecting an operating mode of the power supply. In a first operating mode, the power supply voltage may be equal to a first voltage, and in a second operating mode, the power supply voltage may be substantially equal to a second voltage which is a rational fraction of the first voltage. The clip detection circuit may detect the presence of clipping of the output signal and generate a clip detect signal based on the presence or absence of clipping. The adaptive noise cancellation circuit may generate an anti-noise signal for countering the effects of ambient sounds at an acoustic output of the audio transducer, the adaptive noise cancellation circuit having an adaptive filter for generating the anti-noise signal from a reference microphone signal indicative of ambient audio sounds, wherein the adaptive noise cancellation circuit selectively enables adaptation of the adaptive filter based on the clip detect signal.

In accordance with these and other embodiments of the present disclosure, a method for providing an output signal to an audio transducer may include providing a power supply voltage to a power supply input of a power amplifier having an audio input for receiving an audio input signal and an audio output for providing the output signal, wherein: (i) the charge pump power supply has a select input for selecting an operating mode of the power supply; and (ii) in a first operating mode, the power supply voltage is equal to a first voltage, and wherein in a second operating mode, the power supply voltage is substantially equal to a second voltage which is a rational fraction of the first voltage. The method may also include generating the select input based on a magnitude of anti-noise generated by an adaptive noise cancellation system associated with the audio transducer.

In accordance with these and other embodiments of the present disclosure, a method for providing an output signal to an audio transducer may include providing a power supply voltage to a power supply input of a power amplifier having an audio input for receiving an audio input signal and an audio output for providing the output signal, wherein: (i) the charge pump power supply has a select input for selecting an operating mode of the power supply; and (ii) in a first operating mode, the power supply voltage is equal to a first voltage, and wherein in a second operating mode, the power supply voltage is substantially equal to a second voltage which is a rational fraction of the first voltage. The method may also include detecting the presence of clipping of the output signal and generating a clip detect signal based on the presence or absence of clipping. The method may further include, based on the clip detect signal, enabling adaptation of an adaptive filter of an adaptive noise cancellation circuit for generating an anti-noise signal for countering the effects of ambient sounds at an acoustic output of the audio transducer, the adaptive filter for generating the anti-noise signal from a reference microphone signal indicative of ambient audio sounds.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1A:
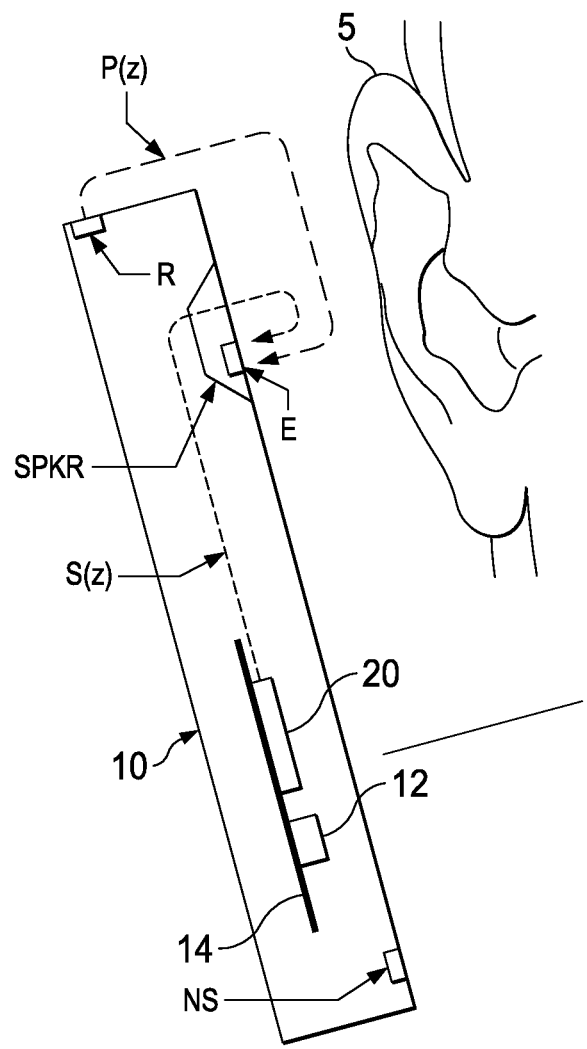
FIG. 1A is an illustration of an example personal audio device, in accordance with embodiments of the present disclosure.

Referring now to FIG. 1A, a personal audio device 10 as illustrated in accordance with embodiments of the present disclosure is shown in proximity to a human ear 5. Personal audio device 10 is an example of a device in which techniques in accordance with embodiments of the invention may be employed, but it is understood that not all of the elements or configurations embodied in illustrated personal audio device 10, or in the circuits depicted in subsequent illustrations, are required in order to practice the invention recited in the claims. Personal audio device 10 may include a transducer such as speaker SPKR that reproduces distant speech received by personal audio device 10, along with other local audio events such as ringtones, stored audio program material, injection of near-end speech (i.e., the speech of the user of personal audio device 10) to provide a balanced conversational perception, and other audio that requires reproduction by personal audio device 10, such as sources from webpages or other network communications received by personal audio device 10 and audio indications such as a low battery indication and other system event notifications. A near-speech microphone NS may be provided to capture near-end speech, which is transmitted from personal audio device 10 to the other conversation participant(s).

Personal audio device 10 may include ANC circuits and features that inject an anti-noise signal into speaker SPKR to improve intelligibility of the distant speech and other audio reproduced by speaker SPKR. A reference microphone R may be provided for measuring the ambient acoustic environment, and may be positioned away from the typical position of a user's mouth, so that the near-end speech may be minimized in the signal produced by reference microphone R. Another microphone, error microphone E, may be provided in order to further improve the ANC operation by providing a measure of the ambient audio combined with the audio reproduced by speaker SPKR close to ear 5, when personal audio device 10 is in close proximity to ear 5. Circuit 14 within personal audio device 10 may include an audio CODEC integrated circuit (IC) 20 that receives the signals from reference microphone R, near-speech microphone NS, and error microphone E, and interfaces with other integrated circuits such as a radio-frequency (RF) integrated circuit 12 having a wireless telephone transceiver. In some embodiments of the disclosure, the circuits and techniques disclosed herein may be incorporated in a single integrated circuit that includes control circuits and other functionality for implementing the entirety of the personal audio device, such as an MP3 player-on-a-chip integrated circuit. In these and other embodiments, the circuits and techniques disclosed herein may be implemented partially or fully in software and/or firmware embodied in computer-readable media and executable by a controller or other processing device.

In general, ANC techniques of the present disclosure measure ambient acoustic events (as opposed to the output of speaker SPKR and/or the near-end speech) impinging on reference microphone R, and by also measuring the same ambient acoustic events impinging on error microphone E, ANC processing circuits of personal audio device 10 adapt an anti-noise signal generated out of the output of speaker SPKR from the output of reference microphone R to have a characteristic that minimizes the amplitude of the ambient acoustic events at error microphone E. Because acoustic path P(z) extends from reference microphone R to error microphone E, ANC circuits are effectively estimating acoustic path P(z) while removing effects of an electro-acoustic path S(z) that represents the response of the audio output circuits of CODEC IC 20 and the acoustic/electric transfer function of speaker SPKR including the coupling between speaker SPKR and error microphone E in the particular acoustic environment, which may be affected by the proximity and structure of ear 5 and other physical objects and human head structures that may be in proximity to personal audio device 10, when personal audio device 10 is not firmly pressed to ear 5. While the illustrated personal audio device 10 includes a two-microphone ANC system with a third near-speech microphone NS, some aspects of the present invention may be practiced in a system that does not include separate error and reference microphones, or a wireless telephone that uses near-speech microphone NS to perform the function of the reference microphone R. Also, in personal audio devices designed only for audio playback, near-speech microphone NS will generally not be included, and the near-speech signal paths in the circuits described in further detail below may be omitted, without changing the scope of the disclosure, other than to limit the options provided for input to the microphone covering detection schemes. In addition, although only one reference microphone R is depicted in FIG. 1, the circuits and techniques herein disclosed may be adapted, without changing the scope of the disclosure, to personal audio devices including a plurality of reference microphones.

Figure 1B:
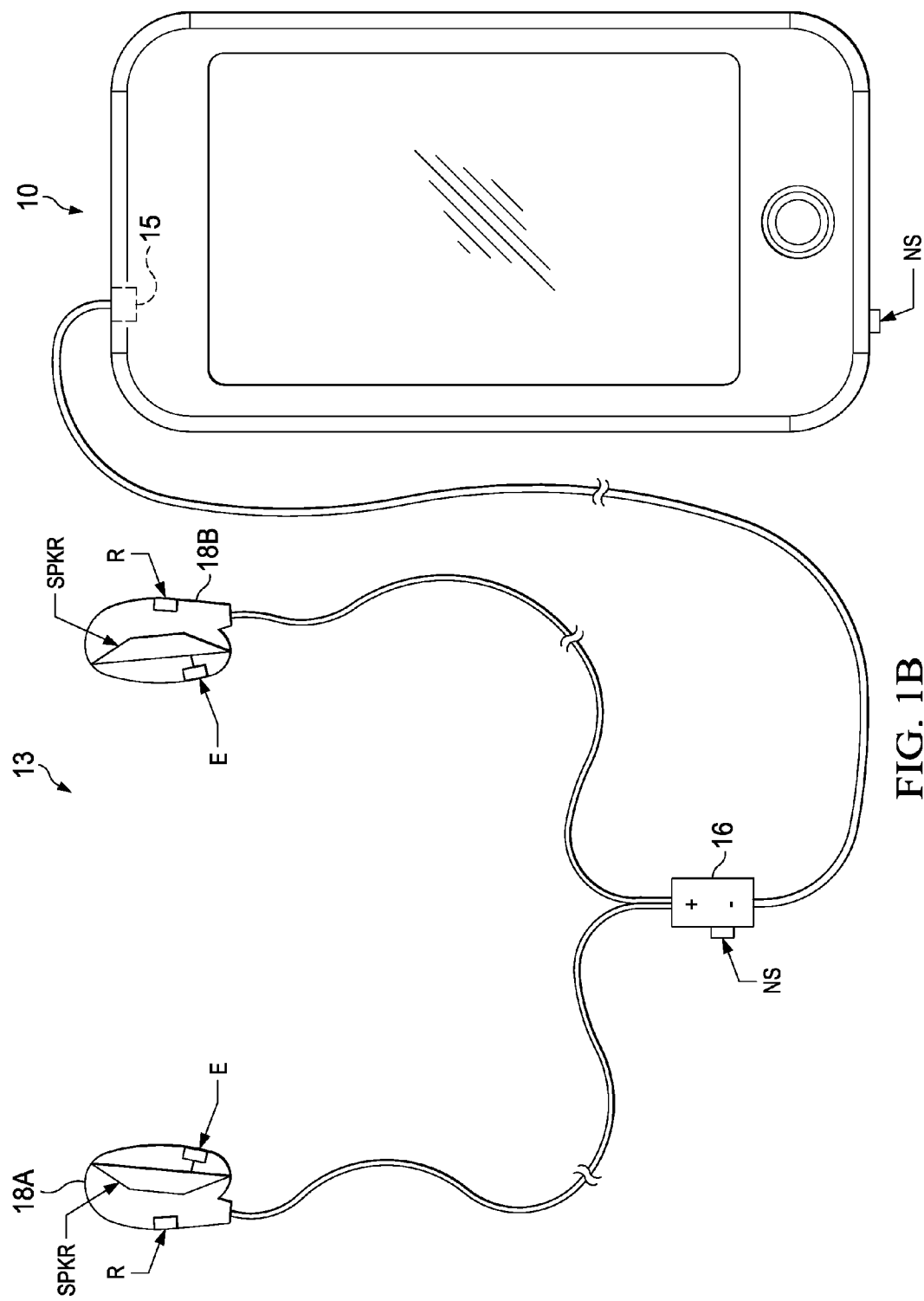
FIG. 1B is an illustration of an example personal audio device with a headphone assembly coupled thereto, in accordance with embodiments of the present disclosure.

Referring now to FIG. 1B, personal audio device 10 is depicted having a headphone assembly 13 coupled to it via audio port 15. Audio port 15 may be communicatively coupled to RF integrated circuit 12 and/or CODEC IC 20, thus permitting communication between components of headphone assembly 13 and one or more of RF integrated circuit 12 and/or CODEC IC 20. As shown in FIG. 1B, headphone assembly 13 may include a combox 16, a left headphone 18A, and a right headphone 18B. As used in this disclosure, the term "headphone" broadly includes any loudspeaker and structure associated therewith that is intended to be mechanically held in place proximate to a listener's ear or ear canal, and includes without limitation earphones, earbuds, and other similar devices. As more specific non-limiting examples, "headphone," may refer to intra-canal earphones, intra-concha earphones, supra-concha earphones, and supra-aural earphones.

Combox 16 or another portion of headphone assembly 13 may have a near-speech microphone NS to capture near-end speech in addition to or in lieu of near-speech microphone NS of personal audio device 10. In addition, each headphone 18A, 18B may include a transducer such as speaker SPKR that reproduces distant speech received by personal audio device 10, along with other local audio events such as ringtones, stored audio program material, injection of near-end speech (i.e., the speech of the user of personal audio device 10) to provide a balanced conversational perception, and other audio that requires reproduction by personal audio device 10, such as sources from webpages or other network communications received by personal audio device 10 and audio indications such as a low battery indication and other system event notifications. Each headphone 18A, 18B may include a reference microphone R for measuring the ambient acoustic environment and an error microphone E for measuring of the ambient audio combined with the audio reproduced by speaker SPKR close a listener's ear when such headphone 18A, 18B is engaged with the listener's ear. In some embodiments, CODEC IC 20 may receive the signals from reference microphone R, near-speech microphone NS, and error microphone E of each headphone and perform adaptive noise cancellation for each headphone as described herein. In other embodiments, a CODEC IC or another circuit may be present within headphone assembly 13, communicatively coupled to reference microphone R, near-speech microphone NS, and error microphone E, and configured to perform adaptive noise cancellation as described herein.

The various microphones referenced in this disclosure, including reference microphones, error microphones, and near-speech microphones, may comprise any system, device, or apparatus configured to convert sound incident at such microphone to an electrical signal that may be processed by a controller, and may include without limitation an electrostatic microphone, a condenser microphone, an electret microphone, an analog microelectromechanical systems (MEMS) microphone, a digital MEMS microphone, a piezo-electric microphone, a piezo-ceramic microphone, or dynamic microphone.

Figure 2:
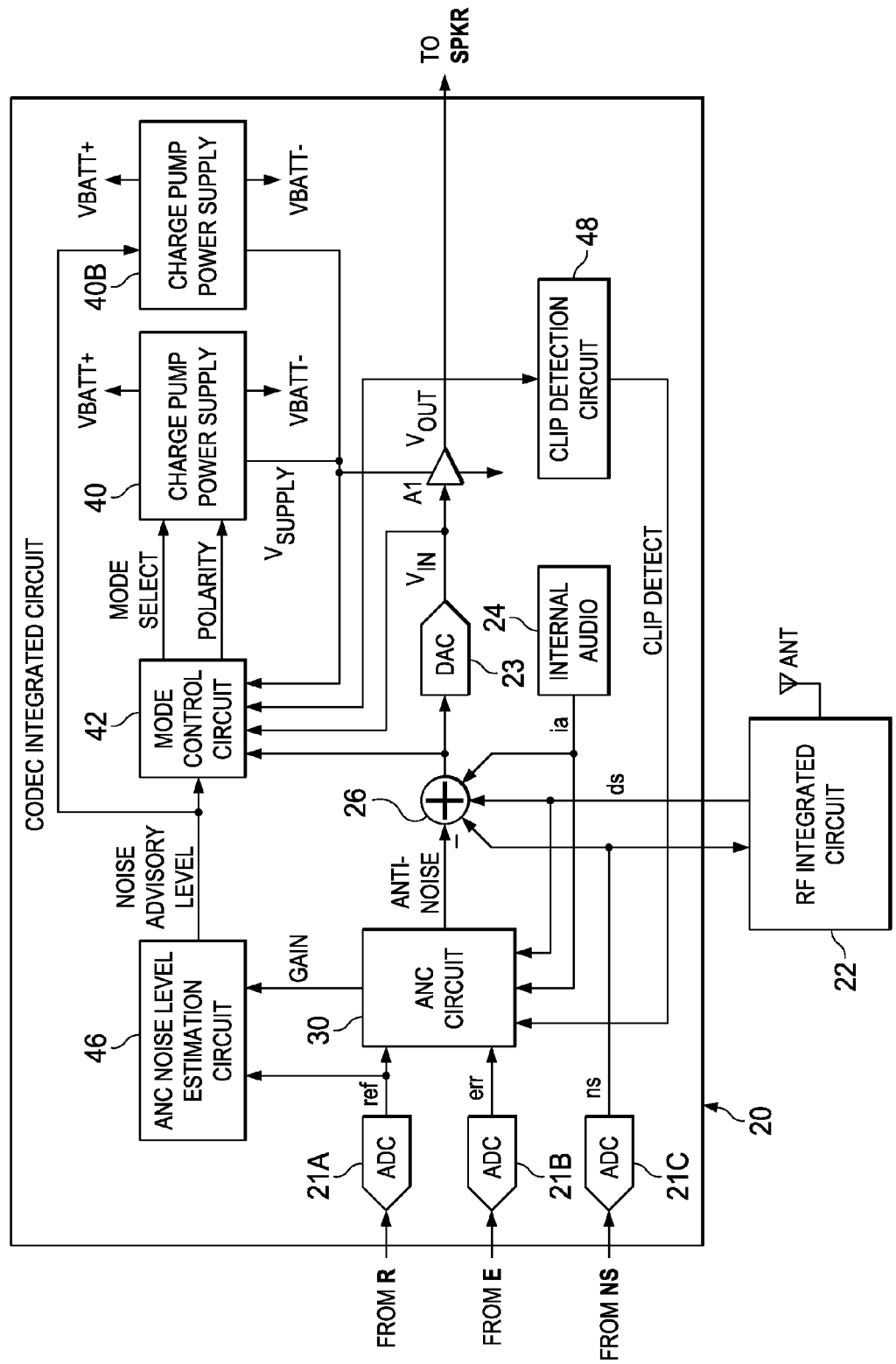
FIG. 2 is a block diagram of selected circuits within the personal audio device depicted in FIG. 1, in accordance with embodiments of the present disclosure.

Referring now to FIG. 2, selected circuits within personal audio device 10, which in other embodiments may be placed in whole or part in other locations such as one or more headphone assemblies 13, are shown in a block diagram. CODEC IC 20 may include an analog-to-digital converter (ADC) 21A for receiving the reference microphone signal and generating a digital representation ref of the reference microphone signal, an ADC 21B for receiving the error microphone signal and generating a digital representation err of the error microphone signal, and an ADC 21C for receiving the near speech microphone signal and generating a digital representation ns of the near speech microphone signal. CODEC IC 20 may generate an audio output signal $V_{OUT}$ for driving speaker SPKR from an amplifier A1, which may amplify an audio input signal $V_{IN}$ received from output of a digital-to-analog converter (DAC) 23, which in turn receives the output of a combiner 26. Combiner 26 may combine audio signals is from internal audio sources 24, the anti-noise signal generated by ANC circuit 30, which by convention has the same polarity as the noise in reference microphone signal ref and is therefore subtracted by combiner 26, and a portion of near speech microphone signal ns so that the user of personal audio device 10 may hear his or her own voice in proper relation to downlink speech ds, which may be received from radio frequency (RF) integrated circuit 22 and may also be combined by combiner 26. Near speech microphone signal ns may also be provided to RF integrated circuit 22 and may be transmitted as uplink speech to the service provider via antenna ANT.

Figure 3:
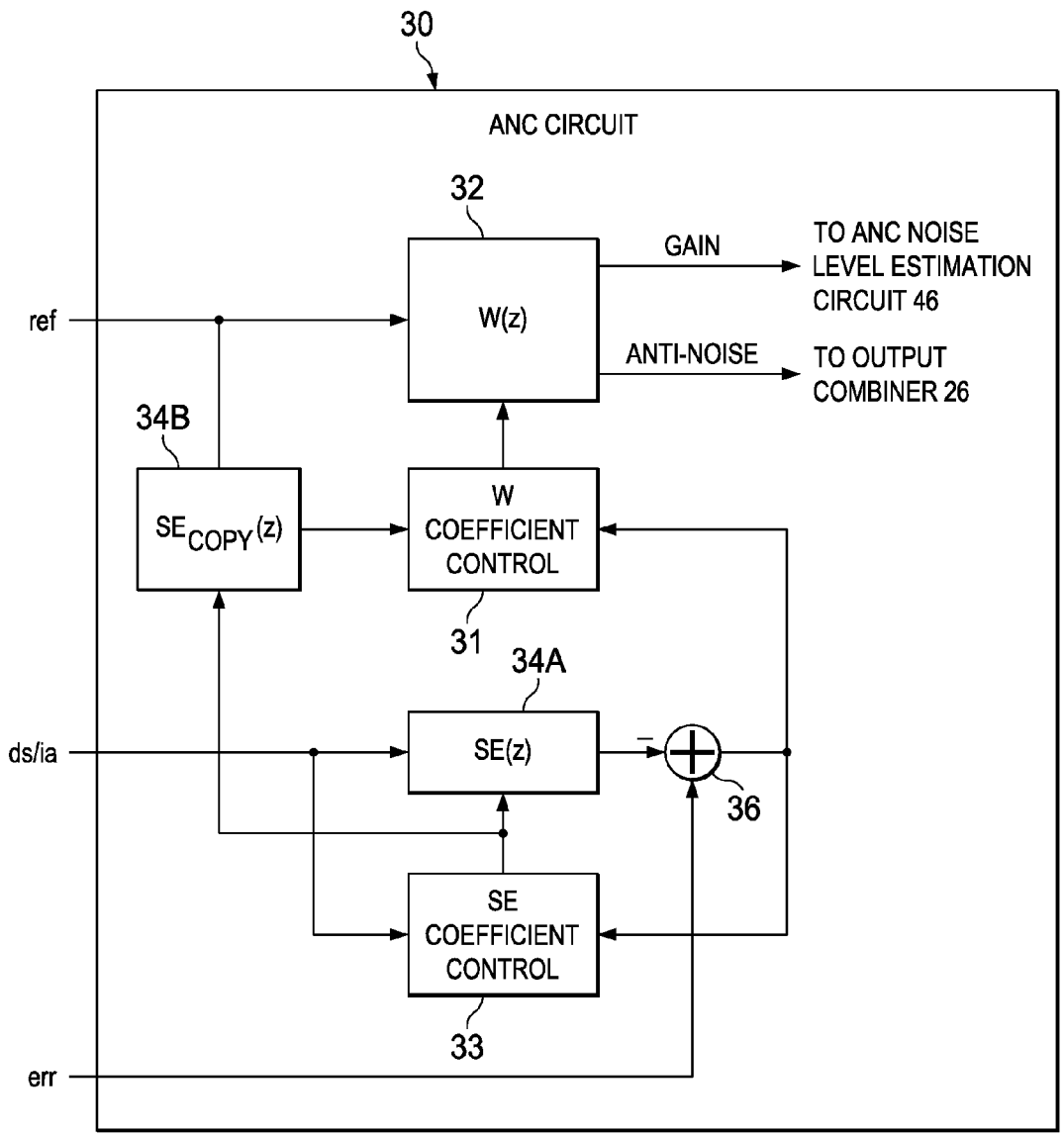
FIG. 3 is a block diagram depicting selected signal processing circuits and functional blocks within an example active noise canceling (ANC) circuit of a coder-decoder (CODEC) integrated circuit of FIG. 3, in accordance with embodiments of the present disclosure.

Referring now to FIG. 3, details of ANC circuit 30 are shown in accordance with embodiments of the present disclosure. Adaptive filter 32 may receive reference microphone signal ref and under ideal circumstances, may adapt its transfer function W(z) to be P(z)/S(z) to generate the anti-noise signal, which may be provided to an output combiner that combines the anti-noise signal with the audio to be reproduced by the transducer, as exemplified by combiner 26 of FIG. 2. The coefficients of adaptive filter 32 may be controlled by a W coefficient control block 31 that uses a correlation of signals to determine the response of adaptive filter 32, which generally minimizes the error, in a least-mean squares sense, between those components of reference microphone signal ref present in error microphone signal err. The signals compared by W coefficient control block 31 may be the reference microphone signal ref as shaped by a copy of an estimate of the response of path S(z) provided by filter 34B and another signal that includes error microphone signal err. By transforming reference microphone signal ref with a copy of the estimate of the response of path S(z), response $SE_{COPY}(z)$, and minimizing the difference between the resultant signal and error microphone signal err, adaptive filter 32 may adapt to the desired response of P(z)/S(z). In addition to error microphone signal err, the signal compared to the output of filter 34B by W coefficient control block 31 may include an inverted amount of source audio signal (e.g., downlink audio signal ds and/or internal audio signal ia) that has been processed by filter response SE(z), of which response $SE_{COPY}(z)$ is a copy. By injecting an inverted amount of source audio signal, adaptive filter 32 may be prevented from adapting to the relatively large amount of source audio signal present in error microphone signal err and by transforming that inverted copy of the source audio signal with the estimate of the response of path S(z), the source audio that is removed from error microphone signal err before comparison should match the expected version of the source audio signal reproduced at error microphone signal err, because the electrical and acoustical path of S(z) is the path taken by the source audio signal to arrive at error microphone E. Filter 34B may not be an adaptive filter, per se, but may have an adjustable response that is tuned to match the response of adaptive filter 34A, so that the response of filter 34B tracks the adapting of adaptive filter 34A.

To implement the above, adaptive filter 34A may have coefficients controlled by SE coefficient control block 33, which may compare the source audio signal and error microphone signal err after removal of the above-described source audio signal, that has been filtered by adaptive filter 34A to represent the expected source audio delivered to error microphone E, and which is removed from the output of adaptive filter 34A by a combiner 36. SE coefficient control block 33 correlates the actual source audio signal with the components of the source audio signal that are present in error microphone signal err. Adaptive filter 34A may thereby be adapted to generate a signal from the source audio signal, that when subtracted from error microphone signal err, contains the content of error microphone signal err that is not due to the source audio signal.

Returning again to FIG. 2, a charge pump power supply 40 may provide the power supply voltage $V_{SUPPLY}$ to a power supply input of amplifier A1 and may receive its own power supply input, generally from a battery or other power supply, depicted as battery terminal connections VBATT+ and VBATT−. In some embodiments, the power supply input of amplifier A1 may include a pair of power supply rail connections substantially symmetric about a reference potential, in which case power supply voltage $V_{SUPPLY}$ provided by charge pump power supply 40 is a bi-polar power supply voltage having a first polarity and a second polarity across the pair of power supply rail connections of the power amplifier. In other embodiments, the power supply input of amplifier A1 may include a single-ended rail connection referenced to a ground voltage, in which case power supply voltage $V_{SUPPLY}$ provided by charge pump power supply 40 is a single-ended power supply voltage.

A mode control circuit 42 may supply a MODE SELECT signal to charge pump power supply 40 that selects an operating mode of charge pump power supply 40 as described in greater detail in U.S. patent application Ser. No. 11/610,496 (the "'496 Application"). Also, output voltage $V_{SUPPLY}$ of charge pump power supply 40 may be adjusted according to expected and/or actual audio signal levels of the output of amplifier A1 according to the techniques disclosed elsewhere in this disclosure and/or in the '496 Application.

When low signal levels exist and/or are expected at amplifier output $V_{OUT}$, the power efficiency of the audio output stage may be improved by varying the power supply voltage $V_{SUPPLY}$ in conformity with the output signal $V_{OUT}$ or a signal (e.g., digital signal generated by combiner 26, the source audio signal, audio input signal $V_{IN}$, etc.) indicative of the output signal $V_{OUT}$. In order to determine the actual and/or expected signal amplitudes at the output of amplifier A1, audio output signal $V_{OUT}$, audio input signal $V_{IN}$, and/or another signal (e.g., digital signal generated by combiner 26, the source audio signal, a signal indicative of a volume setting for speaker SPKR) may be supplied to mode control circuit 42 for selecting an operating mode for controlling the power supply voltage $V_{SUPPLY}$ generated by charge pump power supply 40, in conformity with the expected amplitude of the output signal. Accordingly, charge pump power supply 40 may operate in a plurality of operating modes, wherein in a first operating mode, the power supply voltage $V_{SUPPLY}$ is equal to a first voltage, and wherein in each of the other operating modes, the power supply voltage $V_{SUPPLY}$ is substantially equal to another voltage which is a rational fraction of the first voltage.

Figure 4:
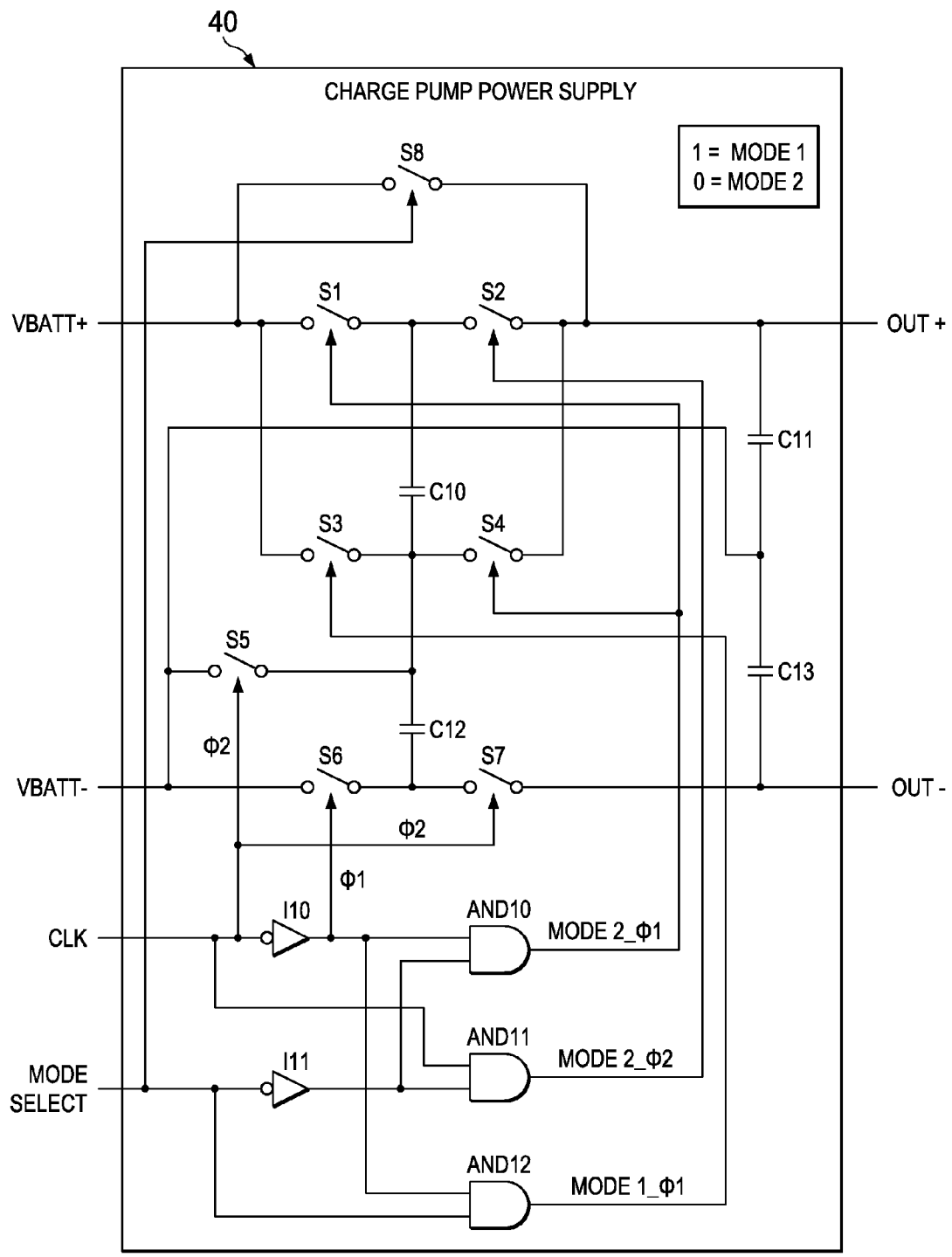
FIG. 4 is a schematic diagram depicting an example charge-pump power supply, in accordance with embodiments of the present disclosure.
Figure 5A:
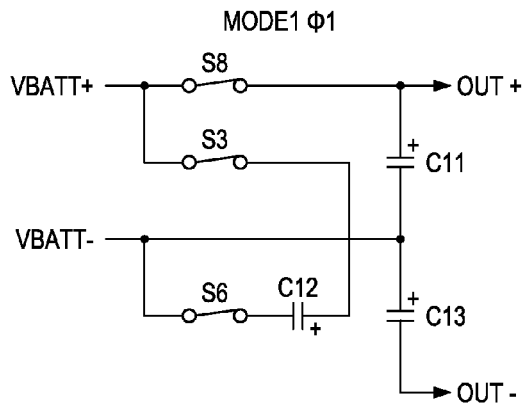
FIGS. 5A-5D are schematic diagrams depicting individual charge-pump clock phases for each operating mode of the charge-pump power supply circuit depicted in FIG. 4, in accordance with embodiments of the present disclosure.
Figure 5B:
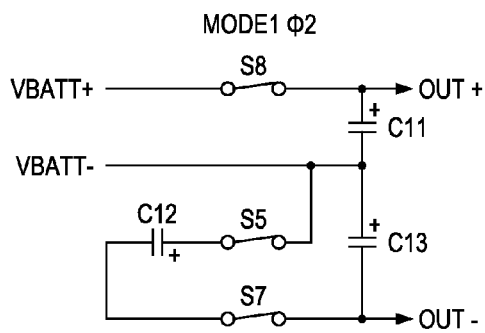

Referring now to FIG. 4 and additionally with reference to FIGS. 5A-5D, details of an example charge pump power supply 40 are depicted, in accordance with embodiments of the present disclosure. When a first operating mode (Mode 1) of charge pump power supply 40 is selected, as may be indicated by the MODE SELECT signal set in the logical high ("1") state, switch S8 may close, and the voltage VBATT+ may be applied directly to the positive polarity terminal (OUT+) of charge pump power supply 40. FIGS. 5A and 5B show an equivalent circuit arrangement for Mode 1 in first and second clock phases, respectively, omitting open switches and inactive circuit components. Switches S1, S2 and S4 are open and not activated in the first operating mode, as logical AND gates AND10 and AND11 disable the control signals to switches S1, S2 and S4, and the inverted Mode Select signal provided by inverter I10 is in a logical low ("0") state. For a single-ended (unipolar) power supply, capacitors C12-C13, switches S3, S6, and switch S7 may be omitted. As illustrated in FIGS. 5A and 5B, in Mode 1, the positive power supply voltage at the positive polarity terminal is supplied directly from the positive input terminal VBATT+.

To produce the negative output supply voltage in mode 1, the input voltage provided between input terminals VBATT+ and VBATT− is inverted by a voltage inverter. In phase one ($\phi_1$) of Mode 1, switches S3 and S6 may be closed, which may charge capacitor C12 by connection across input terminals VBATT+ and VBATT−, as illustrated in FIG. 5A. In phase two ($\phi_2$) of mode 1, switch S3 and switch S6 may open and switch S5 and switch S7 may close, which may reverse the terminal of capacitor C12 applied to the VBATT− input terminal. Switch S7 may apply the terminal of capacitor C12 that was applied to the VBATT− input terminal in phase one, to the negative polarity terminal (OUT−), as further illustrated by FIG. 5B. The switching action described above provides a negative voltage at the negative polarity terminal with respect to the VBATT− terminal that is substantially equal to the magnitude of the voltage between the positive polarity terminal and the VBATT− terminal, which acts as the reference midpoint voltage (ground) at the junction between output capacitors C11 and C13.

In a second operating mode (Mode 2), which may be active when the MODE SELECT signal is in the logical low ("0") state, switch S8 may be opened. In phase one ($\phi_1$) of Mode 2, switches S1 and S4 may be closed, which may apply capacitor C10 in series with output capacitor C11 across the VBATT+ and VBATT− terminals, as further illustrated in FIG. 5C. In phase two ($\phi_2$) of Mode 2, switches S1 and S4 may be opened and switches S2 and S5 may be closed, which may couple capacitor C10 in parallel with capacitor C11 as further illustrated in FIG. 5D. Because the second phase of mode 2 equalizes the voltage on capacitors C10 and C11, the stable operating point of the circuit may be such that the input voltage between the VBATT+ and VBATT− terminals will be split equally during the charging phase, irrespective of the relative capacitance of C10 and C11. Thus, the voltage at the positive polarity output terminal in Mode 2 will be half of the voltage across the VBATT+ and VBATT− terminals. Other ratios can be constructed by switching more capacitors in series with capacitors C10 and C11 during phase one, and connecting them all in parallel during phase two. For example, a voltage of one third of the input battery voltage may be produced by using three capacitors connected alternatively in series across the battery terminals and parallel between the positive polarity terminal and the VBATT− terminal.

Figure 5C:
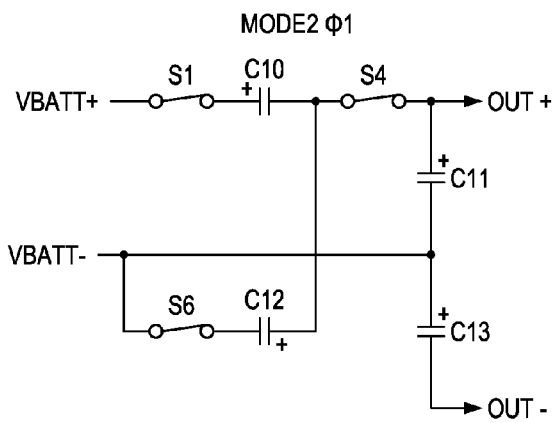
Figure 5D:
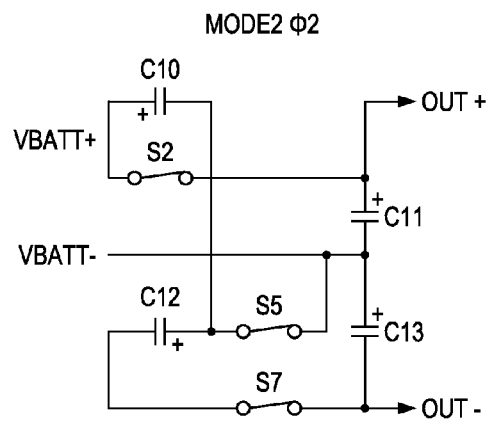

The negative supply in the second operating mode (Mode 2) may be provided in a manner similar to that of the first operating mode, and the connections of capacitor C12 are shown in FIG. 5B and FIG. 5D, as being the same. However, as illustrated in FIG. 5C, because switch S8 is open in the second operating mode, during phase one of Mode 2, capacitor C12 is charged from the positive polarity terminal rather than the VBATT+ terminal as was shown in FIG. 5A for Mode 1. Switch S4 may perform the operation of connecting capacitor C12 to the positive polarity terminal, as illustrated in FIG. 5C, along with the above-described operation of applying capacitor C10 in series with capacitor C11 in phase one for the positive power supply and therefore the relative phases between the voltage inverter supplying the negative polarity terminal voltage and the circuit supplying the positive polarity terminal voltage must be maintained in the depicted configuration. Otherwise, eight switches may be utilized and the common connection between capacitor C10 and C12 broken. The additional switch may be provided between capacitor C12 and the positive polarity terminal, and would be active in Mode 2, phase 1. It is also possible to further reduce the number of switches from seven to six, by removing switch S3 and controlling switch S4 with the unqualified ($\phi$) signal. However, the inclusion of switch S3 may reduce the impedance of the power supply path in the first operating mode, which may be the highest voltage/current operating mode. Therefore, it may generally be advantageous to include switch S3 in the circuit.

Figure 6:
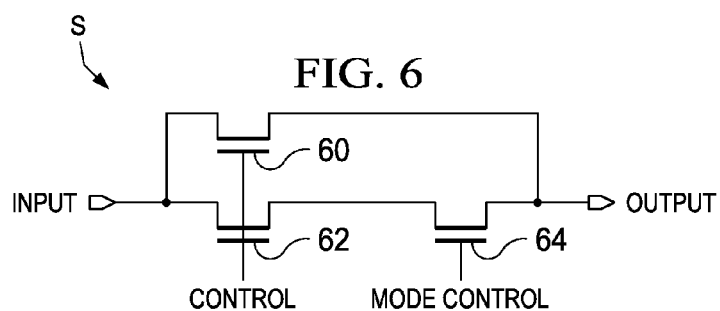
FIG. 6 is a schematic diagram depicting an example switch for use in the charge-pump power supply circuit depicted in FIG. 4, in accordance with embodiments of the present disclosure.

FIG. 6 is a schematic diagram depicting an example switch S for use in the charge-pump power supply circuit depicted in FIG. 4, in accordance with embodiments of the present disclosure. Example switch S may be used to implement one or more of switches S1-S8 depicted in FIG. 4. As shown in FIG. 6, switch S may comprise two or more transistors 60 and 62 each coupled at their respective gate terminals to a control signal for selectively opening or closing switch S, and a transistor 64 coupled in series with transistor 62 and coupled at its gate terminal to a mode control signal for selectively enabling or disabling a transistor. In a "normal" operating mode of switch S, the mode control signal may be asserted such that a path between the input and output terminals of switch S exists through both transistors 60 and 62 when switch S is closed. However, in a "weak" operating mode of switch S, the mode control signal may be deasserted such that a path between the input and output terminals of switch S exists through transistor 60 but not transistor 62 when switch S is closed. Accordingly, switch S may possess a smaller impedance in the normal mode as compared to the weak mode.

Returning again to FIG. 2, CODEC integrated circuit 20 may include an ANC noise level estimation circuit 46. ANC noise level estimation circuit 46 may be configured to generate a noise advisory level signal based on the reference microphone signal ref and/or a gain input signal indicative of a signal gain of an adaptive filter having a response that generates an anti-noise signal from the reference microphone signal (e.g., filter 32 of ANC circuit 30 described above). In addition to the output signal $V_{OUT}$ or a signal (e.g., digital signal generated by combiner 26, the source audio signal, audio input signal $V_{IN}$, etc.) indicative of the output signal $V_{OUT}$, mode control circuit 42 may generate the MODE SELECT signal, and thus control power supply voltage $V_{SUPPLY}$ generated by charge pump power supply 40, based on the noise advisory level signal. For example, in some embodiments, mode control circuit 42 may cause charge pump power supply 40 to transition from an operating mode supplying a lower power supply voltage $V_{SUPPLY}$ to an operating mode supplying a higher power supply voltage $V_{SUPPLY}$ responsive to a determination that the noise advisory level signal indicates that a magnitude of the anti-noise signal is greater than a predetermined threshold magnitude. In such embodiments, the predetermined threshold magnitude may be based on the lower power supply voltage, such that the anti-noise signal exceeding the predetermined threshold may indicate that the anti-noise signal combined with the source audio signal may cause clipping of audio output signal $V_{OUT}$. Accordingly, such increase in power supply voltage $V_{SUPPLY}$ may prevent such clipping from occurring, and avoidance of clipping of audio output signal $V_{OUT}$ in the presence of a large anti-noise signal may prevent ANC circuit 30 from adapting responses of various filters as a result of a clipped audio output signal $V_{OUT}$ which might otherwise lead to instability or incorrect adaptation of elements of ANC circuit 30.

In other embodiments, the predetermined threshold magnitude may be zero, such that if adaptive noise cancellation is simply enabled on a device, the noise advisory level signal may be asserted.

In embodiments in which charge pump power supply 40 has three or more operating modes, including at least a first operating mode in which power supply voltage $V_{SUPPLY}$ is equal to a first voltage, a second operating mode in which power supply voltage $V_{SUPPLY}$ is substantially equal to a second voltage which is a rational fraction of the first voltage, and a third operating mode in which power supply voltage $V_{SUPPLY}$ is equal to a third voltage substantially equal to another rational fraction of the first voltage and less than the second voltage, mode control circuit 42 may cause charge pump power supply 40 to transition from the third operating mode to the first operating mode responsive to a determination that the noise advisory level indicates that a magnitude of the anti-noise signal is greater than a predetermined threshold magnitude. In such embodiments, switches of charge pump power supply 40 may be clocked at their highest possible frequency, in order to facilitate increase in voltage from the third voltage to the first voltage as fast as possible. In these embodiments, after charge pump power supply 40 generates its highest-mode power supply voltage $V_{SUPPLY}$ in order to prevent clipping of audio output signal $V_{OUT}$, power supply voltage $V_{SUPPLY}$ may then be higher than needed to provide generate audio output signal $V_{OUT}$. In such a situation, mode select circuit 42 or another component of CODEC IC 20 may disable the clock signal of charge pump power supply 40, in which case load current of a load coupled to audio output signal $V_{OUT}$ may drain charge of hold capacitors C11 and C13 of charge pump power supply 40, and power supply voltage $V_{SUPPLY}$ may decrease. Power supply voltage $V_{SUPPLY}$ may be monitored (e.g., by clip detection circuit 48) such that once power supply voltage $V_{SUPPLY}$ decreases to the mode-dependent voltage corresponding to the magnitude of the present audio output signal $V_{OUT}$ (e.g., clip detection circuit 48 detects clipping or inadequate headroom), the clock signal of charge pump power supply 40 may again be enabled.

In these and other embodiments, charge pump power supply 40 may have a signal polarity input for indicating a polarity of the output signal. As shown in FIG. 2, such polarity input may be generated by mode control circuit 42. In some embodiments, mode control circuit 42 may determine the polarity of audio output signal $V_{OUT}$ based on a sign bit of the source audio signal. In other embodiments, mode control circuit 42 may determine the polarity of audio output signal $V_{OUT}$ by comparing a load current of a load coupled to the output of amplifier A1 to a quiescent current through at least one driving device of amplifier A1. In yet other embodiments, mode control circuit 42 may determine the polarity of audio output signal $V_{OUT}$ based on a voltage difference between supply voltage $V_{SUPPLY}$ and one or more of battery voltage VBATT+ and VBATT−. In all of these embodiments, when charge pump power supply 40 is operating in an operating mode (e.g., "Mode 2" described above with respect to FIG. 4) with power supply voltage $V_{SUPPLY}$ lesser than another operating mode (e.g., "Mode 1" described above with respect to FIG. 4), and receives a noise advisory level signal indicating that a magnitude of the anti-noise signal is greater than a threshold magnitude, charge pump power supply 40 may operate such that it generates a different magnitude of power supply voltage $V_{SUPPLY}$ relative to a common mode voltage of $V_{SUPPLY}$ based on a signal polarity of audio output signal $V_{OUT}$. For example, if operating in Mode 2, responsive to the signal polarity input indicating a positive polarity of the output signal and the noise advisory level indicating that a magnitude of the anti-noise signal is greater than a threshold magnitude, charge pump power supply 40 may output the voltage associated with Mode 1 to its positive polarity output terminal while outputting the voltage associated with Mode 2 to its negative polarity output terminal. As another example, if operating in Mode 2, responsive to the signal polarity input indicating a negative polarity of the output signal and the noise advisory level indicating that a magnitude of the anti-noise signal is greater than a threshold magnitude, charge pump power supply 40 may output the voltage associated with Mode 1 to its negative polarity output terminal while outputting the voltage associated with Mode 2 to its positive polarity output terminal. In these embodiments, because only one of the output hold capacitors C11 and C13 is charged to a higher voltage based on output signal polarity, a faster effective charging rate may be achieved as compared to traditional approaches, in which both output hold capacitors C11 and C13 are charged to a higher voltage using a finite current from power supply. Such faster effective charging rate may allow charge pump power supply 40 to transition to a higher-mode voltage on one of its terminals, and may thus decrease the likelihood of clipping audio output signal $V_{OUT}$.

In these and other embodiments, the mode control circuit 42 may cause at least one switch S of charge pump power supply 40 to operate in the weak operating mode responsive to a determination that the noise advisory level indicates that a magnitude of the anti-noise signal is lesser than a threshold magnitude and cause the at least one switch to operate in the normal operating mode responsive to a determination that the noise advisory level indicates that a magnitude of the anti-noise signal is greater than the threshold magnitude. Such technique may increase current supplied by charge pump power supply 40 in order to provide a faster increase to a higher power supply voltage $V_{SUPPLY}$ when the noise advisory level signal indicates a need to operate at the higher supply voltage.

As depicted in FIG. 2, CODEC IC 20 may also include a second charge pump power supply 40B for supplying a current to the power supply input of amplifier A1. In some embodiments, capacitors for second charge pump power supply 40B may be on the same integrated circuit as amplifier A1 ("on-chip"), while capacitors of charge pump power supply 40 may be external to the integrated circuit having amplifier A1 ("off-chip"). Accordingly, the capacitors making up second charge pump power supply 40B may be smaller than and may charge faster than those of charge pump power supply 40. Charge pump power supply 40B may be selectively enabled based on the noise advisory level, such that charge pump power supply 40B is enabled responsive to a determination that the noise advisory level indicates that a magnitude of the anti-noise signal is greater than a predetermined threshold magnitude and disabled responsive to a determination that the noise advisory level indicates that a magnitude of the anti-noise signal is lesser than the predetermined threshold magnitude. When enabled, second charge pump power supply 40B may provide signal current via power supply voltage $V_{SUPPLY}$ during mode transitions of charge pump power supply 40. While second charge pump power supply 40B is enabled, slower charging capacitors of charge pump power supply 40 may charge, allowing charge pump power supply 40 to charge to a higher-mode output voltage, and thus speeding up transition of power supply voltage $V_{SUPPLY}$ from its lower mode voltage to its higher mode voltage. In some embodiments, one or more switches (not explicitly shown in the figures) may be configured such that when second charge pump power supply 40B is enabled, charge pump power supply 40 is prevented from providing signal current via power supply voltage $V_{SUPPLY}$. In such embodiments, when second charge pump power supply 40B is enabled, it may enabled for a particular period of time, and during such time, the one or more switches may be arranged to allow second charge pump power supply 40B to provide signal current via power supply voltage $V_{SUPPLY}$, after which the one or more switches may be arranged to allow charge pump power supply 40 to provide signal current via power supply voltage $V_{SUPPLY}$.

Alternatively or in addition to one or more embodiments described above, CODEC IC 20 may include a clip detection circuit 48. Clip detection circuit 48 may include any system, device, or apparatus configured to determine whether audio output signal $V_{OUT}$ is clipped or is in danger of being clipped by its available power supply voltage $V_{SUPPLY}$ and generate a clip detect signal based on the presence or absence of clipping. Accordingly, clip detection circuit 48 may include one or more comparators for comparing audio output signal $V_{OUT}$ to the rail voltages of power supply voltage $V_{SUPPLY}$ and determining whether output signal $V_{OUT}$ is within a predetermined threshold of either of the rail voltages of power supply voltage $V_{SUPPLY}$. In such embodiments, ANC circuit 30 may selectively enable adaptation of one or more adaptive filters of ANC circuit 30 based on the clip detect signal (e.g., may disable adaptation when the clip detect signal indicates the presence of clipping). Such disabling of adaptation in the presence of clipping of output signal $V_{OUT}$ may prevent ANC circuit 30 from adapting responses of various filters as a result of a clipped audio output signal $V_{OUT}$ which might otherwise lead to instability or incorrect adaptation of elements of ANC circuit 30.

Alternatively or in addition to one or more embodiments described above, ANC circuit 30 may selectively enable adaptation of one or more adaptive filters of ANC circuit 30 responsive to transition of charge pump power supply 40 from a lower voltage mode to a higher voltage mode. Such disabling of adaptation in the presence of a transition in power supply voltage $V_{SUPPLY}$ may prevent ANC circuit 30 from adapting responses of various filters as a result of a clipped audio output signal $V_{OUT}$ which might otherwise lead to instability or incorrect adaptation of elements of ANC circuit 30.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An audio amplifier circuit for providing an output signal to an audio transducer, the audio amplifier circuit comprising:
    a power amplifier having an audio input for receiving an audio input signal, an audio output for providing the output signal, and a power supply input;
    a charge pump power supply for providing a power supply voltage to the power supply input of the power amplifier, wherein:
        the charge pump power supply has a select input for selecting an operating mode of the power supply; and
        in a first operating mode, the power supply voltage is equal to a first voltage, and wherein in a second operating mode, the power supply voltage is substantially equal to a second voltage which is a rational fraction of the first voltage; and
    a control circuit for generating the select input based on a magnitude of anti-noise generated by an adaptive noise cancellation system associated with the audio transducer.

2. The audio amplifier circuit of claim 1, further comprising an adaptive noise cancellation noise level estimation circuit for generating a noise advisory level signal based on:
    a reference microphone signal indicative of ambient audio sounds in an acoustic output of the transducer; and
    a gain input signal indicative of a signal gain of an adaptive filter having a response that generates an anti-noise signal from the reference microphone signal, wherein the anti-noise signal counters the effect of ambient audio sounds in the acoustic output of the transducer; and
    wherein the control circuit generates the select input based on the noise advisory level signal.

3. The audio amplifier circuit of claim 1, wherein the control circuit further generates the select input based on a signal indicative of the magnitude of the output signal.

4. The audio amplifier circuit of claim 1, wherein the control circuit causes the charge pump power supply to transition from the second operating mode to the first operating mode responsive to a determination that a magnitude of the anti-noise signal is greater than a threshold magnitude.

5. The audio amplifier circuit of claim 4, wherein the threshold magnitude is based on the power supply voltage in the second operating mode.

6. The audio amplifier circuit of claim 1, wherein:
    in a third operating mode, the power supply voltage is equal to a third voltage substantially equal to another rational fraction of the first voltage and less than the second voltage; and
    wherein the control circuit causes the charge pump power supply to transition from the third operating mode to the first operating mode responsive to a determination that a magnitude of the anti-noise signal is greater than a threshold magnitude.

7. The audio amplifier circuit of claim 1, wherein:
    the power supply input comprises a pair of power supply rail connections substantially symmetric about a reference potential; and
    the power supply voltage provided by the charge pump power supply is a bi-polar power supply voltage having a first polarity and a second polarity across the pair of power supply rail connections of the power amplifier.

8. The audio amplifier circuit of claim 7, wherein:
    the charge pump power supply has a signal polarity input for indicating a polarity of the output signal;
    the charge pump power supply increases a magnitude of the first polarity of the power supply voltage and maintains a magnitude of the second polarity of the power supply voltage substantially constant responsive to the signal polarity input indicating a positive polarity of the output signal and a magnitude of the anti-noise signal is greater than a threshold magnitude; and
    the charge pump power supply increases the magnitude of the second polarity of the power supply voltage and maintains the magnitude of the first polarity of the power supply voltage substantially constant responsive to the signal polarity input indicating a negative polarity of the output signal and the magnitude of the anti-noise signal is greater than a threshold magnitude.

9. The audio amplifier circuit of claim 1, wherein:
    the charge pump power supply comprises a plurality of switches for switching one or more capacitors to provide the first polarity voltage and the second polarity voltage;
    in normal operating mode, at least one switch of the plurality of switches has a first impedance and in a weak operating mode, the at least one switch has a second impedance greater than the first impedance; and
    the control circuit causes the at least one switch to operate in the weak operating mode responsive to a determination that a magnitude of the anti-noise signal is lesser than a threshold magnitude and causes the at least one switch to operate in the normal operating mode responsive to a determination that the magnitude of the anti-noise signal is greater than the threshold magnitude.

10. The audio amplifier circuit of claim 1, further comprising a selectively enabled second charge pump power supply for generating current to the power supply input, wherein the control circuit enables the second charge pump power supply responsive to a determination that the noise advisory level signal indicates that a magnitude of the anti-noise signal is greater than the threshold magnitude and disables the second charge pump power supply responsive to a determination that the noise advisory level signal indicates that a magnitude of the anti-noise signal is lesser than a threshold magnitude.

11. An audio amplifier circuit for providing an output signal to an audio transducer, the audio amplifier circuit comprising:
   a power amplifier having an audio input for receiving an audio input signal, an audio output for providing the output signal, and a power supply input;
   a charge pump power supply for providing a power supply voltage to the power supply input of the power amplifier, wherein:
      the charge pump power supply has a select input for selecting an operating mode of the power supply; and
      in a first operating mode, the power supply voltage is equal to a first voltage, and wherein in a second operating mode, the power supply voltage is substantially equal to a second voltage which is a rational fraction of the first voltage;
   a clip detection circuit for detecting the presence of clipping of the output signal and generating a clip detect signal based on the presence or absence of clipping; and
   an adaptive noise cancellation circuit for generating an anti-noise signal for countering the effects of ambient sounds at an acoustic output of the audio transducer, the adaptive noise cancellation circuit having an adaptive filter for generating the anti-noise signal from a reference microphone signal indicative of ambient audio sounds, wherein the adaptive noise cancellation circuit selectively enables adaptation of the adaptive filter based on the clip detect signal.

12. A method for providing an output signal to an audio transducer, comprising:
   providing by a charge pump power supply a power supply voltage to a power supply input of a power amplifier having an audio input for receiving an audio input signal and an audio output for providing the output signal, wherein:
      the charge pump power supply has a select input for selecting an operating mode of the power supply; and
      in a first operating mode, the power supply voltage is equal to a first voltage, and wherein in a second operating mode, the power supply voltage is substantially equal to a second voltage which is a rational fraction of the first voltage; and
   generating the select input based on a magnitude of anti-noise generated by an adaptive noise cancellation system associated with the audio transducer.

13. The method of claim 12, further comprising:
   generating a noise advisory level signal based on:
      a reference microphone signal indicative of ambient audio sounds in an acoustic output of the transducer; and
      a gain input signal indicative of a signal gain of an adaptive filter having a response that generates an anti-noise signal from the reference microphone signal, wherein the anti-noise signal counters the effect of ambient audio sounds in the acoustic output of the transducer; and
   generating the select input based on the noise advisory level signal.

14. The method of claim 12, further comprising generating the select input based on a signal indicative of the magnitude of the output signal.

15. The method of claim 12, further comprising transitioning the charge pump power supply from the second operating mode to the first operating mode responsive to a determination that a magnitude of the anti-noise signal is greater than a threshold magnitude.

16. The method of claim 12, wherein the threshold magnitude is based on the power supply voltage in the second operating mode.

17. The method of claim 12, wherein in a third operating mode, the power supply voltage is equal to a third voltage substantially equal to another rational fraction of the first voltage and less than the second voltage, and the method further comprises transitioning the charge pump power supply from the third operating mode to the first operating mode responsive to a determination that a magnitude of the anti-noise signal is greater than a threshold magnitude.

18. The method of claim 12, wherein:
   the power supply input comprises a pair of power supply rail connections substantially symmetric about a reference potential; and
   the power supply voltage provided by the charge pump power supply is a bi-polar power supply voltage having a first polarity and a second polarity across the pair of power supply rail connections of the power amplifier.

19. The method of claim 18, wherein the charge pump power supply has a signal polarity input for indicating a polarity of the output signal, and the method further comprises:
   increasing a magnitude of the first polarity of the power supply voltage and maintaining a magnitude of the second polarity of the power supply voltage substantially constant responsive to the signal polarity input indicating a positive polarity of the output signal and a magnitude of the anti-noise signal is greater than a threshold magnitude; and
   increasing the magnitude of the second polarity of the power supply voltage and maintaining the magnitude of the first polarity of the power supply voltage substantially constant responsive to the signal polarity input indicating a negative polarity of the output signal and the magnitude of the anti-noise signal is greater than a threshold magnitude.

20. The method of claim 12, wherein:
   the charge pump power supply comprises a plurality of switches for switching one or more capacitors to provide the first polarity voltage and the second polarity voltage; and
   in a normal operating mode, at least one switch of the plurality of switches has a first impedance and in a weak operating mode, the at least one switch has a second impedance greater than the first impedance;
   wherein the method further comprises operating the at least one switch in the weak operating mode responsive to a determination that a magnitude of the anti-noise signal is lesser than a threshold magnitude and operating the at least one switch in the normal operating mode responsive to a determination that the magnitude of the anti-noise signal is greater than the threshold magnitude.

21. The method of claim 12, further comprising:
enabling a selectively enabled second charge pump power supply for generating current to the power supply input responsive to a determination that the noise advisory level signal indicates that a magnitude of the anti-noise signal is greater than the threshold magnitude; and
disabling the second charge pump power supply responsive to a determination that the noise advisory level signal indicates that a magnitude of the anti-noise signal is lesser than a threshold magnitude.

22. A method for providing an output signal to an audio transducer, comprising:
providing a power supply voltage to a power supply input of a power amplifier having an audio input for receiving an audio input signal and an audio output for providing the output signal, wherein:
the charge pump power supply has a select input for selecting an operating mode of the power supply; and
in a first operating mode, the power supply voltage is equal to a first voltage, and wherein in a second operating mode, the power supply voltage is substantially equal to a second voltage which is a rational fraction of the first voltage;
detecting the presence of clipping of the output signal and generating a clip detect signal based on the presence or absence of clipping; and
based on the clip detect signal, enabling adaptation of an adaptive filter of an adaptive noise cancellation circuit for generating an anti-noise signal for countering the effects of ambient sounds at an acoustic output of the audio transducer, the adaptive filter for generating the anti-noise signal from a reference microphone signal indicative of ambient audio sounds.

* * * * *